US008222704B2

(12) United States Patent
Manning et al.

(10) Patent No.: US 8,222,704 B2
(45) Date of Patent: Jul. 17, 2012

(54) COMPACT ELECTRICAL SWITCHING DEVICES WITH NANOTUBE ELEMENTS, AND METHODS OF MAKING SAME

(75) Inventors: H. Montgomery Manning, Eagle, ID (US); Thomas Rueckes, Rockport, MA (US); Claude L. Bertin, Venice, FL (US)

(73) Assignee: Nantero, Inc., Woburn, MA (US)

( * ) Notice: Subject to any disclaimer, the term of this patent is extended or adjusted under 35 U.S.C. 154(b) by 227 days.

(21) Appl. No.: 12/651,288

(22) Filed: Dec. 31, 2009

(65) Prior Publication Data
US 2011/0156009 A1 Jun. 30, 2011

(51) Int. Cl.
*H01L 29/12* (2006.01)
*H01L 29/41* (2006.01)
*H01L 29/43* (2006.01)
*H01L 27/11* (2006.01)

(52) U.S. Cl. ..... 257/379; 257/5; 257/365; 257/E27.009; 257/E29.123; 977/742; 977/936; 365/148

(58) Field of Classification Search ............ None
See application file for complete search history.

(56) References Cited

U.S. PATENT DOCUMENTS

| 4,527,181 | A | 7/1985 | Sasaki et al. |
| 6,057,637 | A | 5/2000 | Zettl et al. |
| 6,128,214 | A | 10/2000 | Kuekes et al. |
| 6,256,767 | B1 | 7/2001 | Kuekes et al. |
| 6,277,318 | B1 | 8/2001 | Bower et al. |
| 6,314,019 | B1 | 11/2001 | Kuekes et al. |
| 6,342,276 | B1 | 1/2002 | You et al. |
| 6,409,567 | B1 | 6/2002 | Amey, Jr. et al. |
| 6,422,450 | B1 | 7/2002 | Zhou et al. |
| 6,423,583 | B1 | 7/2002 | Avouris et al. |
| 6,445,006 | B1 | 9/2002 | Brandes et al. |
| 6,495,116 | B1 | 12/2002 | Herman |
| 6,495,258 | B1 | 12/2002 | Chen et al. |
| 6,515,339 | B2 | 2/2003 | Shin |
| 6,528,020 | B1 | 3/2003 | Dai et al. |

(Continued)

FOREIGN PATENT DOCUMENTS
GB 2364933 2/2002
(Continued)

OTHER PUBLICATIONS

Ago, H. et al., "Workfunction of Purified and Oxidised Carbon Nanotubes," *Synthetic Metals*, 103 (1999), 2494-2495.
Ajayan, P.M. et al., "Applications of Carbon Nanotubes," *Topics in Applied Physics*, 80 (2001), 391-425.
Avouris, P., "Carbon Nanotube Electronics," *Chemical Physics*, 281 (2002), 429-445.

(Continued)

*Primary Examiner* — Victor A Mandala
*Assistant Examiner* — Joseph Schoenholtz
(74) *Attorney, Agent, or Firm* — Jones Day

(57) ABSTRACT

An electrical device includes a substrate; first and second active areas; first and second word lines disposed in a first plane; first and second bit lines in a second plane and in electrical communication with first and second active areas; and a reference line disposed in a third plane. A nanotube element disposed in a fourth plane is in electrical communication with first and second active areas and the reference line via electrical connections at a first surface of the nanotube element. The nanotube element includes first and second regions having resistance states that are independently adjustable in response to electrical stimuli, wherein the first and second regions nonvolatilely retain the resistance states. Arrays of such electrical devices can be formed as nonvolatile memory devices. Methods for fabricating such devices are also disclosed.

8 Claims, 23 Drawing Sheets

U.S. PATENT DOCUMENTS

| | | | |
|---|---|---|---|
| 6,548,841 B2 | 4/2003 | Frazier et al. | |
| 6,630,772 B1 | 10/2003 | Bower et al. | |
| 6,645,628 B2 | 11/2003 | Shiffler, Jr. et al. | |
| 6,706,402 B2 | 3/2004 | Rueckes et al. | |
| 6,707,098 B2 | 3/2004 | Hofmann et al. | |
| 6,759,693 B2 | 7/2004 | Vogeli et al. | |
| 6,806,840 B2 | 10/2004 | Hung et al. | |
| 6,808,746 B1 | 10/2004 | Dai et al. | |
| 6,809,465 B2 | 10/2004 | Jin | |
| 6,833,558 B2 | 12/2004 | Lee et al. | |
| 6,835,591 B2 | 12/2004 | Rueckes et al. | |
| 6,858,197 B1 | 2/2005 | Delzeit | |
| 6,863,942 B2 | 3/2005 | Ren et al. | |
| 6,894,359 B2 | 5/2005 | Bradley et al. | |
| 6,899,945 B2 | 5/2005 | Smalley et al. | |
| 6,918,284 B2 | 7/2005 | Snow et al. | |
| 6,919,592 B2 | 7/2005 | Segal et al. | |
| 6,919,740 B2 | 7/2005 | Snider | |
| 6,921,575 B2 | 7/2005 | Horiuchi et al. | |
| 6,924,538 B2 | 8/2005 | Jaiprakash et al. | |
| 6,946,410 B2 | 9/2005 | French et al. | |
| 6,969,651 B1* | 11/2005 | Lu et al. | 438/257 |
| 6,982,903 B2* | 1/2006 | Bertin et al. | 365/163 |
| 6,990,009 B2 | 1/2006 | Bertin et al. | |
| 6,995,649 B2 | 2/2006 | Nugent | |
| 7,015,500 B2 | 3/2006 | Choi et al. | |
| 7,057,402 B2 | 6/2006 | Cole et al. | |
| 7,115,901 B2 | 10/2006 | Bertin et al. | |
| 7,115,960 B2 | 10/2006 | Bertin et al. | |
| 7,161,403 B2 | 1/2007 | Bertin | |
| 7,253,118 B2 | 8/2007 | Tran et al. | |
| 7,329,610 B2 | 2/2008 | Tsuchiya | |
| 7,332,767 B2 | 2/2008 | Wang et al. | |
| 7,365,385 B2 | 4/2008 | Abbott | |
| 7,479,654 B2* | 1/2009 | Bertin et al. | 257/40 |
| 7,566,478 B2 | 7/2009 | Ward et al. | |
| 7,667,999 B2 | 2/2010 | Herner et al. | |
| 7,835,170 B2* | 11/2010 | Bertin et al. | 365/148 |
| 7,894,253 B2* | 2/2011 | Kreupl et al. | 365/163 |
| 7,982,209 B2 | 7/2011 | Herner et al. | |
| 2001/0004979 A1 | 6/2001 | Han et al. | |
| 2001/0023986 A1 | 9/2001 | Mancevski | |
| 2002/0160111 A1 | 10/2002 | Sun et al. | |
| 2002/0175390 A1 | 11/2002 | Goldstein et al. | |
| 2003/0004058 A1 | 1/2003 | Li et al. | |
| 2003/0122111 A1 | 7/2003 | Glatkowski | |
| 2003/0177450 A1 | 9/2003 | Nugent | |
| 2003/0200521 A1 | 10/2003 | DeHon et al. | |
| 2004/0005723 A1 | 1/2004 | Empedocles et al. | |
| 2004/0007528 A1 | 1/2004 | Bakajin et al. | |
| 2004/0023253 A1 | 2/2004 | Kunwar et al. | |
| 2004/0031975 A1 | 2/2004 | Kern et al. | |
| 2004/0041154 A1 | 3/2004 | Watanabe et al. | |
| 2004/0043527 A1 | 3/2004 | Bradley et al. | |
| 2004/0071949 A1 | 4/2004 | Glatkowski et al. | |
| 2004/0099438 A1 | 5/2004 | Arthur et al. | |
| 2004/0104129 A1 | 6/2004 | Gu et al. | |
| 2004/0181630 A1 | 9/2004 | Jaiprakash et al. | |
| 2004/0253167 A1 | 12/2004 | Silva et al. | |
| 2004/0265550 A1 | 12/2004 | Glatkowski et al. | |
| 2005/0053525 A1 | 3/2005 | Segal et al. | |
| 2005/0056877 A1 | 3/2005 | Rueckes et al. | |
| 2005/0095938 A1 | 5/2005 | Rosenberger et al. | |
| 2006/0237537 A1 | 10/2006 | Empedocles et al. | |
| 2006/0250843 A1 | 11/2006 | Bertin et al. | |
| 2006/0250856 A1 | 11/2006 | Bertin et al. | |
| 2006/0258122 A1 | 11/2006 | Whitefield et al. | |
| 2006/0264053 A1 | 11/2006 | Yates | |
| 2006/0267537 A1 | 11/2006 | Baumann et al. | |
| 2006/0281256 A1 | 12/2006 | Carter et al. | |
| 2006/0281287 A1 | 12/2006 | Yates et al. | |
| 2006/0292716 A1 | 12/2006 | Gu et al. | |
| 2007/0004191 A1 | 1/2007 | Gu et al. | |
| 2007/0121369 A1* | 5/2007 | Happ | 365/148 |
| 2007/0268742 A1* | 11/2007 | Liu | 365/163 |
| 2008/0012047 A1 | 1/2008 | Bertin et al. | |
| 2008/0070162 A1 | 3/2008 | Ufert | |
| 2008/0142850 A1* | 6/2008 | Bertin et al. | 257/213 |
| 2008/0157126 A1 | 7/2008 | Bertin et al. | |
| 2008/0158936 A1 | 7/2008 | Bertin et al. | |
| 2008/0159042 A1* | 7/2008 | Bertin et al. | 365/225.7 |
| 2009/0103350 A1* | 4/2009 | Kund | 365/148 |
| 2009/0140232 A1* | 6/2009 | Ufert | 257/4 |
| 2009/0166609 A1 | 7/2009 | Schricker et al. | |
| 2009/0166610 A1 | 7/2009 | Schricker et al. | |
| 2009/0168491 A1 | 7/2009 | Schricker et al. | |
| 2009/0194839 A1* | 8/2009 | Bertin et al. | 257/476 |
| 2009/0278111 A1* | 11/2009 | Pop | 257/4 |
| 2009/0303801 A1* | 12/2009 | Kim | 365/189.05 |
| 2010/0001267 A1* | 1/2010 | Manning et al. | 257/40 |
| 2010/0084626 A1* | 4/2010 | Delhougne et al. | 257/4 |
| 2010/0108977 A1* | 5/2010 | Yoon et al. | 257/4 |
| 2010/0237318 A1* | 9/2010 | Choi et al. | 257/4 |
| 2010/0320569 A1* | 12/2010 | Narita | 257/537 |
| 2011/0051499 A1* | 3/2011 | Hamilton | 365/148 |

FOREIGN PATENT DOCUMENTS

| | | |
|---|---|---|
| JP | 2000-203821 | 7/2000 |
| JP | 2001-035362 | 2/2001 |
| JP | 2004-090208 | 3/2004 |
| WO | WO 98/39250 | 9/1998 |
| WO | WO 99/65821 | 12/1999 |
| WO | WO 00/48195 | 8/2000 |
| WO | WO 01/03208 | 1/2001 |
| WO | WO 02/45113 | 6/2002 |
| WO | WO 02/48701 | 6/2002 |
| WO | WO 03/016901 | 2/2003 |
| WO | WO 03/034142 | 4/2003 |

OTHER PUBLICATIONS

Bachtold, A. et al., Logic Circuits Based on Carbon Nanotubes, *Physica E*, 16 (2003), 42-46.

Banerjee, S. et al., "Functionalization of Carbon Nanotubes with a Metal-Containing Molecular Complex," *Nano Letters*, 2:1 (2002), 49-53.

Berhan, L. et al., "Mechanical Properties of Nanotube Sheets: Alterations in Joint Morphology and Achievable Moduli in Manufacturable Materials," *J Applied Physics*, 95:8 (Apr. 15, 2004), 4335-4345.

Bonard, J. et al., "Monodisperse Multiwall Carbon Nanotubes Obtained with Ferritin as Catalyst," *Nano Letters*, 2:6 (2002), 665-667.

Cassell, A.M. et al., "Large Scale CVD Synthesis of Single-Walled Carbon Nanotubes," *J. Phys. Chem. B.*, 103 (1999), 6484-6492.

Chen, B. et al., "Heterogeneous Single-Walled Carbon Nanotube Catalyst Discovery and Optimization," *Chem Mater*, 14 (2002), 1891-1896.

Cheng, H.M. et al., "Large-Scale and Low-Cost Synthesis of Single-Walled Carbon Nanotubes by the Catalytic Pyrolysis of Hydrocarbons," *Applied Physics Letters*, 72:25 (Jun. 22, 1998), 3282-3284.

Chen, J. et al., Self-Aligned Carbon Nanotube Transistors with Charge Transfer Doping, *Applied Physics Letters*, 86 (2005) 123108.

Chen, J. et al., "Self-Aligned Carbon Nanotube Transistors with Novel Chemical Doping," *IEEE IEDM*, (2004), 695-698.

Chiang, I.W. et al., Purification and Characterization of Single-Wall Carbon Nanotubes (SWNTs) Obtained from the Gas-Phase Decomposition of CO (HiPco Process), *J Phys Chem B*, 105 (2001), 8297-8301.

International Searching Authority, International Search Report and Written Opinion for related International Patent Application No. PCT/US2009/047683, Jul. 31, 2009.

Dai, H. et al., "Controlled Chemical Routes to Nanotube Architectures, Physics and Devices," *J Phys Chem B*, 103 (Dec. 7, 1999) 11246-11255.

Delzeit, L. et al., "Multilayered Metal Catalysts for Controlling the Density of Single-Walled Carbon Nanotube Growth," *Chemical Physics Letters*, 348 (Nov. 16, 2001), 368-374.

Derycke, V. et al., "Carbon Nanotube Inter- and Intramolecular Logic Gates," *Nano Letters*, 1:9 (Sep. 2001), 453-456.

Derycke, V. et al., "Controlling Doping and Carrier Injection in Carbon Nanotube Transistors," *Applied Physics Letters*, 80:15 (Apr. 15, 2002), 2773-2775.

Desai, A. et al., "Freestanding Carbon Nanotube Specific Fabrication," *Proceeding of 2005 5th IEEE Conference Nanotechnology*, Nagoya, Japan (Jul. 2005), 4 pages.

Duan, X. et al., "Nonvolatile Memory and Programmable Logic from Molecular-Gated Nanowires," *Nano Letters*, 2:5 (2002), 487-490.

Franklin, N.R. et al., "An Enhanced CVD Approach to Extensive Nanotube Networks with Directionality," *Advanced Materials*, (2002), 890-894.

Haddon, R.C. et al., "Purification and Separation of Carbon Nanotubes," *MRS Bulletin*, (Apr. 2004), 252-259.

Hafner, J.H. et al., "Catalytic Growth of Single-Wall Carbon Nanotubes from Metal Particles," *Chemical Physics Letters*, 296 (Oct. 30, 1998), 195-202.

Heinze, S. et al., "Carbon Nanotubes as Schottky Barrier Transistors," *Physical Review Letters*, 89:10 (Sep. 2, 2002), 106801-1-106801-4.

Homma, Y. et al., "Single Walled Carbon Nanotube Growth on Silicon Substrates Using Nanoparticle Catalysts," *Jpn J Appl Physic*, 41:2:1A/B (2002), L89-91.

Huang, Y. et al., "Logic Gates and Computation from Assembled Nanowire Building Blocks," *Science*, 294 (Nov. 9, 2001), 1313-1317.

Javey, A. et al., "Carbon Nanotube Field-Effect Transistors with Integrated Ohmic Contacts and High-κ Gate Dielectrics," *Nano Letters*, 4:3 (2004), 447-450.

Javey, A. et al., "Carbon Nanotube Transistor Arrays for Multistage Complementary Logic and Ring Oscillators," *Nano Letters*, 2:9 (2002), 929-932.

Javey, A. et al., "High-κ Dielectric for Advanced Carbon-Nanotube Transistors and Logic Gates," *Nature Materials*, 1 (Dec. 2002, published online Nov. 17, 2002), 241-246.

Jeong, T. et al., "A New Purification Method of Single-Wall Carbon Nanotubes Using $H_2S$ and $O_2$ Mixture Gas," *Chemical Physics Letters*, 344 (Aug. 17, 2001) 18-22.

Joselevich, E. et al., Vectorial Growth of Metallic and Semiconducting Single-Wall Carbon Nanotubes, *Nano Letters*, 2:10 (2002), 1137-1141.

Kahn, M.G.C. et al., "Solubilization of Oxidized Single-Walled Carbon Nanotubes in Organic and Aqueous Solvents through Organic Derivatizaton," *Nano Letters*, 2:11 (2002), 1215-1218.

Kong, J. et al., "Chemical Vapor Deposition of Methane for Single-Walled Carbon Nanotubes," *Chemical Physics Letters*, 292 (Aug. 14, 1998), 567-574.

Kong, J. et al., "Nanotube Molecular Wires as Chemical Sensors," *Science*, 287 (Jan. 28, 2000) 622-625.

Li, J. et al., "Carbon Nanotube Nanoelectrode Array for Ultrasensitive DNA Detection," *Nano Letters*, 3:5 (2003) 597-602.

Li, Y. et al., "Growth of Single-Walled Carbon Nanotubes from Discrete Catalytic Nanoparticles of Various Sizes," *J. Phys. Chem. B*, 105 (2001), 11424-11431.

Li, Y. et al., "Preparation of Monodispersed Fe—Mo Nanoparticles as the Catalyst for CVD Synthesis of Carbon Nanotubes," *Chem Mater*, 13 (2001), 1008-1014.

Lin, Y. et al., "Novel Carbon Nanotube FET Design with Tunable Polarity," *IEEE IEDM*, (2004), 687-690.

Martel, R. et al., "Carbon Nanotube Field-Effect Transistors and Logic Circuits," *Annual ACM IEEE Design Automation Conference*, New Orleans, LA (Jun. 10-14, 2002), 94-98.

Nerushev, O.A. et al., "Carbon Nanotube Films Obtained by Thermal Chemical Vapour Deposition," *J. Mater Chem*, 11 (2001), 1122-1132.

Niu, C. et al., "High Power Electrochemical Capacitors Based on Carbon Nanotube Electrodes," *Appl Phys Lett*, 70:11 (Mar. 17, 1997), 1480-1482.

Onoa, G.B. et al., "Bulk Production of Singly Dispersed Carbon Nanotubes with Prescribed Lengths," *Nanotechnology*, 16 (2005), 2799-2803.

Parikh, K. et al., "Flexible Vapour Sensors Using Single Walled Carbon Nanotubes," *Sensors and Actuators B*, 113 (2006), 55-63.

Peigney, A. et al., "A Study of the Formation of Single- and Double-Walled Carbon Nanotubes by a CVD Method," *J. Phys Chem B*, 105 (2001) 9699-9710.

Qi, P. et al., "Toward Large Arrays of Multiplex Functionalization Carbon Nanotube Sensors for Highly Sensitive and Selective Molecular Detection," *Nano Lett*, 3:3 (2003) 347-351.

Radosavljevic, M. et al., "Nonvolatile Molecular Memory Elements Based on Ambipolar Nanotube Field Effect Transistors," *Nano Letters*, 2:7 (2002), 761-764.

Rueckles, T. et al., "Carbon Nanotube-Based Nonvolatile Random Access Memory for Molecular Computer," *Science*, 289 (Jul. 7, 2000), 94-97.

Shelimov, K.B. et al., "Purification of Single-Wall Carbon Nanotubes by Ultrasonically Assisted Filtration," *Chem Phys Lett*, 282 (1998), 429-434.

Sotiropoulou, S. et al., Carbon Nanotube Array-Based Biosensor, *Anal Bioanal Chem*, 375 (2003), 103-105.

Valentini, L. et al., "Sensors for Sub-ppm $NO_2$ Gas Detection Based on Carbon Nanotube Thin Films," *Applied Physics Letters*, 82:6 (Feb. 10, 2003), 961-963.

Wind, S.J. et al., "Fabrication and Electrical Characterization of Top Gate Single-Wall Carbon Nanotube Field-Effect Transistors," *IBM T.J. Watson Research Center* (2002), 14 pages.

Wind, S.J. et al., "Vertical Scaling of Carbon Nanotube Field-Effect Transistors Using Top-Gate Electrodes," *Applied Physics Letters*, 80:20 (May 20, 2002), 3817-3819.

Zhang, Y et al., "Metal Coating on Suspended Carbon Nanotubes and Its Implication of Metal-Tube Interaction," *Chemical Physics Letters*, 331 (Nov. 24, 2000), 35-41.

Zhang, Y. et al., "Formation of Metal Nanowires on Suspended Single-Walled Carbon Nanotubes," *Applied Physics Letters*, 77:19 (Nov. 6, 2000), 3015-3017.

Zhang, Z. et al., "Select Pathways to Carbon Nanotube Film Growth," *Advanced Materials*, 13:23 (Nov. 23, 2001), 1767-1770.

Zhao, Y.-P. et al., "Frequency-Dependent Electrical Transport in Carbon Nanotubes," *Physical Review B*, 64 (2001), 201402 (4 pages).

Awano, Yuji, "Graphene for VLSI: FET and Interconnect Applications," *IEDM 2009 Technical Digest*, 2009, pp. 10.1.1-10.1.4.

Brown, Kenneth M., "System in Package 'The Rebirth of SIP'," *2004 IEEE Custom Integrated Circuits*, May 2004, 6 pages.

Crowley, M. et al., "512Mb PROM with 8 Layers of Antifuse/Diode Cells," *IEEE International Solid-State Circuits Conference*, vol. XLVI, Feb. 2003, 24 pages.

Cui, J.B. et al., "Carbon Nanotube Memory Devices of High Charge Storage Stability," *Applied Physics Letters*, vol. 81, No. 17, Oct. 21, 2002, pp. 3260-3262.

Fishburn, F. et al., "A 78nm $6F^2$ DRAM Technology for Multigigabit Densities," *2004 Symposium on VLSI Technology Digest of Technical Papers*, IEEE, 2004, pp. 28-29.

Fuhrer, M.S. et al., "High-Mobility Nanotube Transistor Memory," *Nano Letters*, vol. 2, No. 7, May 2002, pp. 755-759.

Huai, Yiming, "Spin-Transfer Torque MRAM (STT-MRAM): Challenges and Prospects," *AAPS Bulletin*, vol. 18, No. 6, Dec. 2008, pp. 33-40.

Jiang, Y. et al., "Performance Breakthrough in 8 nm Gate Length Gate-All-Around Nanowire Transistors using Metallic Nanowire Contacts," *2008 Symposium on VLSI Technology Digest of Technical Papers*, 2008, pp. 34-35.

Langer, L. et al., "Electrical Resistance of a Carbon Nanotube Bundle," *J. Mater. Res.*, vol. 9, No. 4, Apr. 1994, pp. 927-932.

Novak, J.P. et al., "Nerve Agent Detection Using Networks of Single-Walled Carbon Nanotubes," *Applied Physics Letters*, vol. 83, No. 19, Nov. 10, 2003, pp. 4026-4028.

Servalli, G., "A 45nm Generation Phase Change Memory Technology," *IEDM 2009 Technical Digest*, 2009, pp. 5.7.1-5.7.4.

Snow, E.S. et al., "Random Networks of Carbon Nanotubes as an Electronic Material," *Applied Physics Letters*, vol. 82, No. 13, Mar. 31, 2003, pp. 2145-2147.

Star, A. et al., "Nanoelectronic Carbon Dioxide Sensors," *Adv. Mater.*, vol. 16, No. 22, Nov. 2004, pp. 2049-2052.

Star, A. et al., "Nanotube Optoelectronic Memory Devices," *Nano Letters*, vol. 4, No. 9, Jun. 16, 2004, pp. 1587-1591.

\* cited by examiner

COMPACT ELECTRICAL SWITCHING DEVICES WITH NANOTUBE ELEMENTS, AND METHODS OF MAKING SAME

BACKGROUND

1. Technical Field

This application generally relates to electrical switching devices made using fabrics of carbon nanotube elements, which can serve as storage elements in nonvolatile memory devices.

2. Discussion of Related Art

Metal-oxide-semiconductor field-effect transistors (MOSFETs) are ubiquitous in modern electronics. These transistors possess the simultaneous qualities of bistability, high switching speed, low power dissipation, high reliability, and scalability to small dimensions. However, one feature not typical of MOSFETs is the ability to retain a digital state (e.g., a memory state) in the absence of applied power. As such, MOSFETs are frequently paired with other elements that are capable of storing a digital state. For example, flash memory cells resemble MOSFETS, but also include an insulated floating gate that is interposed between the control gate and the MOSFET channel and holds a charge representative of a digital state. Because this charge partially screens the control gate's electrical field, the digital state can be determined by measuring the voltage or current across the MOSFET channel. However, flash memory has a finite number of read/write cycles, leading to low long-term reliability; additionally, although each flash memory cell can be written and read independently, erase and rewrite operations must be performed on blocks of cells. Dynamic random access memory (DRAM) include MOSFETs coupled to capacitors that stores digital states as charge. Because the charge gradually leaks from the capacitors, the states must be refreshed periodically, e.g., every 64 ms or less, requiring separate circuitry. As such, in the absence of electrical power, DRAM loses the stored states; that is, the memory is volatile. Other conventional memory devices suffer from similar, or other, deficiencies.

There is also an ever-increasing demand to reduce the size of MOSFET arrays, enabling ever-greater numbers of devices (e.g., state-storing devices, such as memory cells) to be fabricated in a given area. This demand challenges the semiconductor industry to move to denser technology nodes, having smaller line and spacing dimensions and requiring improved alignment between layers. MOSFETs and associated storage elements must be scaled to smaller dimensions and/or redesigned. Additionally, because smaller devices have an increased sensitivity to defects, the density of defects generated during the manufacturing process needs to be reduced correspondingly.

U.S. Patent Application Publication No. 2008/0012047 discloses two-terminal switching devices that include first and second conductive terminals and a nanotube article, wherein at least a portion of the nanotube article overlaps the conductive terminals. Suitable application of electrical stimuli can change the relative resistance of the nanotube article between a relatively high resistance state and a relatively low resistance state.

U.S. Pat. No. 7,479,654 discloses a memory array that includes a plurality of memory cells, each of which receives a bit line, a first word line and a second word line. Each memory cell also includes a two-terminal switching device that includes first and second conductive terminals in electrical communication with a nanotube article.

U.S. patent application Ser. No. 12/486,602, filed Jun. 17, 2009 and entitled "NRAM Arrays with Nanotube Blocks, Nanotube Traces, and Nanotube Planes and Methods of Making Same," discloses nanotube memory arrays that include a nanotube fabric layer disposed in electrical communication with first and second conductor layers. A circuit induces a change in the resistance of the nanotube fabric layer between the first and second conductor layers. Two adjacent memory cells can be formed in at least two selected cross sections of the nanotube fabric and conductor layers such that each memory cell is uniquely addressable and programmable. A change in resistance corresponds to a change in an informational state of the memory cell.

SUMMARY

Exemplary embodiments of electrical switching devices comprising fabrics of carbon nanotube elements are described. The switching devices can serve as storage elements in nonvolatile memory devices. Exemplary methods of making and using the same are described.

Under one aspect, an electrical device includes a substrate having an upper surface, a first active area in the substrate, a second active area in the substrate, a first word line and a second word line disposed in a first plane positioned above the upper surface of the substrate. The device also includes a first bit line in electrical communication with the first active area, and a second bit line in electrical communication with the second area, the first and second bit lines being disposed in a second plane positioned above the first plane. The device also includes a first reference line in a third plane positioned above the first plane, and a first nanotube element disposed in a fourth plane positioned above the first plane, the first nanotube element having a first surface and extending laterally in the fourth plane parallel to a plane of the substrate. The first nanotube element is in electrical communication with the first and second active areas and with the first reference line via electrical contacts at the first surface of the first nanotube element. The nanotube element includes first and second regions having resistance states that are independently adjustable in response to electrical stimuli, wherein the first and second regions nonvolatilely retain the resistance states.

A resistance state of a first region of the first nanotube element can be independently adjustable responsive to electrical stimulus on the first word line and at least one of the first bit line and the first reference line, the first region nonvolatilely retaining the first resistance state, and a resistance state of a second region of the first nanotube element can be independently adjustable responsive to electrical stimulus on the second word line and at least one of the second bit line and the first reference line, the second region nonvolatilely retaining the second resistance state.

The first active area can comprise a first source region, a first drain region, and a first channel region disposed between the first source region and the first drain region. The second active area can comprise a second source region, a second drain region, and a second channel region disposed between the second source region and the second drain region. The first word line can be disposed over the first channel region, and the second word line can be disposed over the second channel region. The first bit line can be in electrical communication with the first drain region, and the second bit line can be in electrical communication with the second drain region.

In some embodiments, the device also includes a third active area in the substrate, the third active area including a third source region, the first drain region, and a third channel region disposed between the third source region and the first drain region; a fourth active area in the substrate, the fourth active area including a fourth source region, the second drain region, and a fourth channel region disposed between the fourth source region and the second drain region; a third word line disposed over the third channel region, and a fourth word line disposed over the fourth channel region, the third and fourth word lines being in the first plane; second and third reference lines in the third plane; and a second nanotube element in electrical communication with the third source region and the second reference line, a resistance state of the second nanotube element being independently adjustable responsive to electrical stimulus on the third word line and at least one of the first bit line and the second reference line; and a third nanotube element in electrical communication with the fourth source region and the third reference line, a resistance state of the third nanotube element being independently adjustable responsive to electrical stimulus on the fourth word line and at least one of the second bit line and the third reference line.

In some embodiments, the resistance states of the first and second regions of the nanotube element are each independently adjustable between a low resistance state and a high resistance state, the low resistance state corresponding to a digital "1" state and the high resistance state corresponding to a digital "0" state.

In some embodiments, the resistance states of the first and second regions of the nanotube element are each independently adjustable between a low resistance state, a high resistance state, and at least one intermediate resistance state.

In some embodiments, the third plane is positioned above the fourth plane. In other embodiments, the third plane is positioned between the second and fourth planes.

In some embodiments, the first and second word lines are arranged parallel to the release line. In other embodiments, at least a portion of each of first and second bit lines is arranged at an obtuse angle relative to the first and second word lines. The first and second channel regions can be arranged at an acute angle relative to the first and second word lines. In one example, the obtuse angle is about 104°, and wherein the acute angle is about 76°. In some embodiments, at least a portion of the first nanotube element is arranged at the obtuse angle relative to the first and second word lines. The first nanotube element can be laterally offset relative to the first and second bit lines.

In some embodiments, the first nanotube element defines a trace extending substantially parallel to the first and second bit lines. In other embodiments, the first nanotube element extends over the first and second active areas, the first and second word lines, and the first and second bit lines.

Some embodiments further include peripheral circuitry for applying electrical stimulus to the first and second word lines, the first and second bit lines, and the reference line.

Some embodiments further include a passivation layer disposed on the nanotube element, the passivation layer having a gap defined therein, the gap being adjacent to the nanotube element.

In some embodiments, the nanotube element includes substantially a monolayer of nanotubes.

In some embodiments, the first region extends laterally between a conductive stud in contact with the first drain region and the reference line, and the second region extends laterally between a conductive stud in contact with the second drain region and the reference line.

Under another aspect, an array of electrical devices includes a substrate having an upper surface, and a plurality of active areas in the substrate, a plurality of word lines in a first plane positioned above the upper surface of the substrate, a plurality of bit lines in a second plane positioned above the first plane, each bit line being in electrical communication with one of the active areas, and a plurality of reference lines in a third plane positioned above the first plane. The array also includes at least one nanotube element in a fourth plane positioned above the first and second planes, the at least one nanotube element having a plurality of nanotube regions, each nanotube region in electrical communication with an active area and a reference line via electrical contacts at a first surface of the first nanotube element, the plurality of nanotube regions having resistance states that are independently adjustable in response to electrical stimuli. Each nanotube region shares a reference line with an adjacent nanotube region, and each nanotube region shares a bit line with an adjacent nanotube region.

Under another aspect, a method of making a device includes providing a substrate, forming first and second active areas in the substrate, forming a first word line and a second word line in a first plane positioned above the upper surface of the substrate, forming first and second bit lines in a second plane positioned above the first plane, and forming a first reference line in a third plane positioned above the upper surface of the substrate. The method also includes forming a first nanotube element in a fourth plane positioned above the first and second planes, the first nanotube element having a first surface and extending laterally in the fourth plane parallel to a plane of the substrate. The method also includes forming electrical connections between the first bit line and the first active area, between the second bit line and the second active area, between the first nanotube element and the first reference line, between the first nanotube element and the first active area, and between the first nanotube element and the second active area, such that the first nanotube element is in electrical communication with the first active region, the second active region and the first reference line via electrical contacts at the first surface of the first nanotube element.

In some embodiments, the method further includes forming third and fourth active areas in the substrate, the third active area including a third source region, the first drain region, and a third channel region disposed between the third source region and the first drain region, the fourth active area including a fourth source region, the second drain region, and a fourth channel region disposed between the fourth source region and the second drain region; forming a third word line over the third channel region, and forming a fourth word line over the fourth channel region, the third and fourth word lines being in the first plane; forming second and third reference lines in the third plane; forming second and third nanotube elements in the fourth plane; and forming electrical connections between the second nanotube element and the third source region, between the second nanotube element and the second reference line, between the third nanotube element and the fourth source region, and between the third nanotube element and the third reference line.

DETAILED DESCRIPTION

Figure 1:
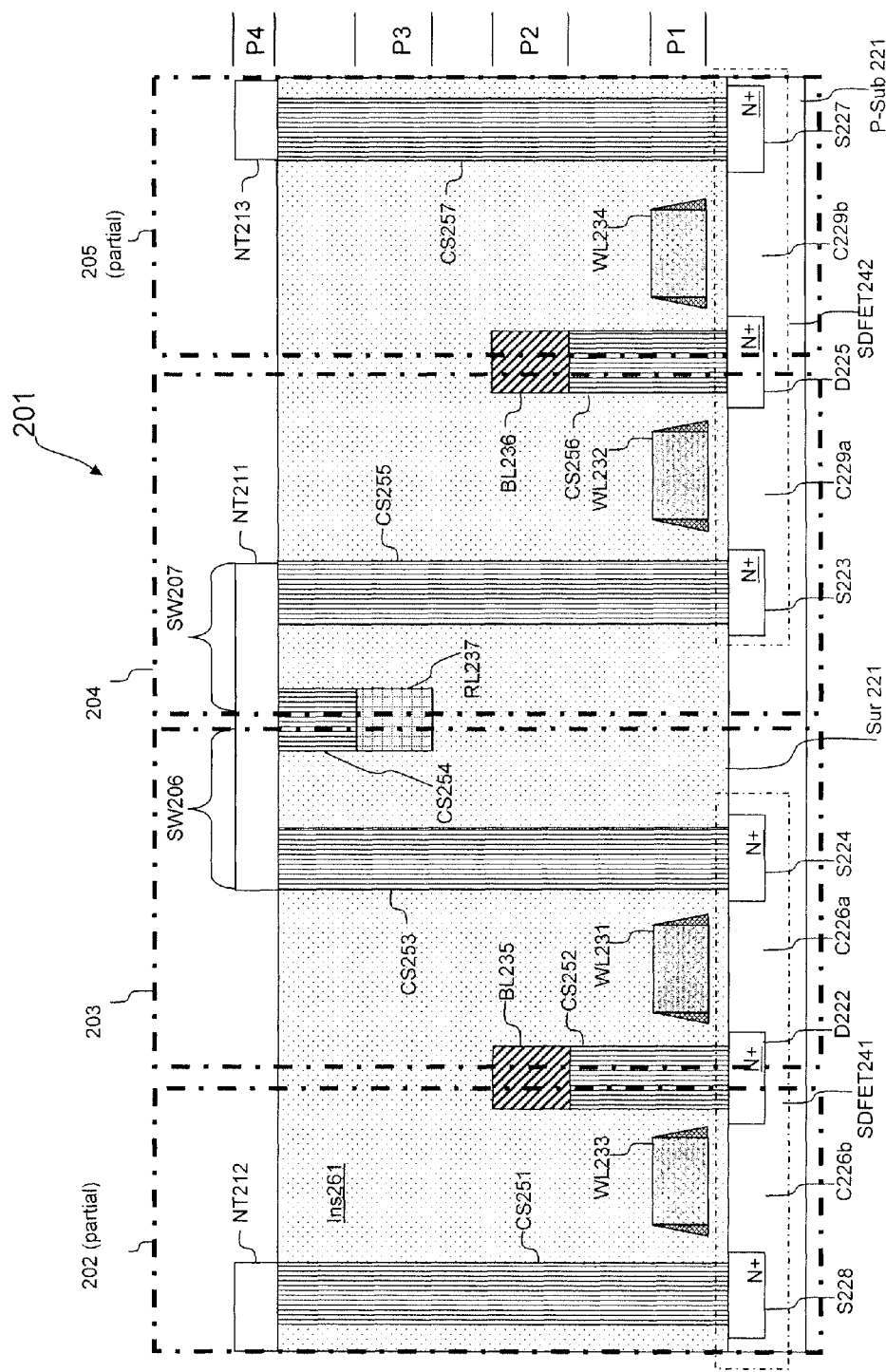
FIG. 1 schematically illustrates a cross-sectional view of a plurality of switching devices comprising nanotube fabric elements with certain nanotube fabric elements shared among the devices, according to an exemplary embodiment.

Exemplary embodiments of electrical switching devices comprising fabrics of carbon nanotube elements are described. The switching devices can serve as storage elements in nonvolatile memory devices. Exemplary embodiments may provide nonvolatile switching devices that include nanotube elements positioned in a plane that lies above the bit line plane and above the planes of other conductive lines such as word lines and reference lines. Positioning nanotube elements in a plane that lies above the bit line plane and/or other conductive planes may provide useful features, including, for example providing for ease of fabrication and compatibility with conventional semiconductor processing (since the nanotube elements can be integrated at a late stage of the device fabrication process). According to various exemplary embodiments, some or all of the addressing elements for the devices, such as select transistors, word lines, bit lines, and/or reference lines, can be fabricated in steps that precede the fabrication of the nanotube elements. Indeed, all of the addressing elements can potentially be formed using a conventional fabrication facility, and the nanotube elements then formed on top of those elements; the nanotube element forming step can, but need not necessarily, be performed in the conventional fabrication facility. Moving the nanotube element formation step to near the end of the fabrication process can thus obviate the need to specially account for any process variations that might result from the presence of embedded nanotube elements and can improve the overall efficiency of the fabrication process.

Exemplary embodiments may permit various nanotube elements to be shared among switching devices, thereby reducing the footprint of each device and increasing the density of devices per unit area. For example, some embodiments include a nanotube element that is shared between two independently addressable switching devices. The nanotube is placed in electrical communication with first, second, and third addressing elements, such as a reference line and two word lines. These three elements can be used to apply voltage differences across two different regions of the nanotube element, enabling each of those regions to be used to store a digital state. Specifically, the resistance state of a first region of the nanotube element, between the first and second addressing elements, can be independently adjusted by applying appropriate electrical stimulus (e.g., appropriate voltages) to one or both of the first and second addressing elements. The resistance state of a second region of the nanotube element, between the first and third addressing elements, can be independently adjusted by applying appropriate electrical stimulus to one or both of the first and third addressing elements. The first and second regions of the nanotube element nonvolatilely retain their respective programmed resistance states, which can be non-destructively read out. The resistance states can be assigned to represent digital logic states, e.g., "1" or "0" for each region of the nanotube element. The device footprints can be further reduced by sharing other elements among the switching devices and/or by arranging the bit lines, word lines, reference lines, nanotube elements, and FET active areas at specified angles to one another.

FIG. 1 illustrates in cross section an electrical device 201 comprising a plurality of switching devices 202, 203, 204 and 205 constructed according an to exemplary embodiment. The principle of operation of each individual switching device 202, 203, 204, or 205 can be the same. As discussed elsewhere herein, the arrangement of the various features of each switching device 202, 203, 204 and 205, and the sharing of certain features between adjacent switching devices reduces the footprint of each individual device and facilitates the fabrication process.

Referring to FIG. 1 (and in particular to the regions identified by reference numerals 203 and 204), electrical device 201 comprises a substrate P-Sub 221 having an upper surface Sur 221. A first active area, FET (field effect transistor) active area SDFET241, is formed in the substrate P-sub 221. The first active area SDFET241 comprises a first source region S224, a first drain region D222, and a first channel region C226a disposed between the first source region S224 and the first drain region D222. A second active area SDFET242 is also formed in the substrate P-sub 221. The second active area SDFET242 comprises a second source region S223, a second drain region D225, and a second channel region C229a disposed between the second source region S223 and the second drain region D225. The first active area SDFET241 also comprises a third source region S228 and a third channel region C226b disposed between the third source region S228 and the first drain region D222. The second active area SDFET242 also comprises a fourth source region S227 and a fourth channel region C229b disposed between the fourth source region S227 and the second drain region D225.

A first word line WL231 is disposed over the first channel region C226a, a second word line WL232 is disposed over the second channel region C229a, a third word line WL233 is disposed over the third channel region C226b, and a fourth word like WL234 is disposed over the fourth channel region C229b. The first and second word lines WL231, WL232 are located in a first plane P1 positioned above the upper surface Sur 221 of the substrate P-sub 221. The word lines WL231, WL232 (and other conductive lines) are disposed within insulator Ins261 as is evident from FIG. 1. A first bit line BL235 is in electrical communication with the first drain region D222 of the active region SDFET241 (by virtue of conductive stud CS252) and a second bit line BL236 is in electrical communication with the second drain region D225 of the active region SDFET242 (by virtue of conductive stud CS256). The first and second bit lines BL235, BL236 are located in a second plane P2 positioned above the first plane P1. Electrical communication as referred to herein can occur by electrical components being in direct contact with one another. Electrical communication can also occur where electrical components are indirectly connected with each other via other electrical components or are in suitable proximity such that an electrical stimulus at one component affects the other component even though they are not in contact.

A first reference line RL237 is located in a third plane P3 positioned above the first plane P1. In the example of FIG. 1, the third plane containing the first reference line RL237 is also positioned above the second plane P2 containing the first and second bit lines BL235, BL236.

Conventional semiconductor processing, e.g., typical CMOS processing, involving creation of diffusion regions, metallization, planarization, lithography, etching, deposition of insulating materials, etc., can be used to form the underlying device architectures for the active regions and conductive lines as described elsewhere herein.

Electrical device 201 also includes a first nanotube element NT211. The first nanotube element NT211 is located in a fourth plane P4 positioned above the first and second planes P1, P2, and has a first surface located at the bottom of NT211 and extends laterally in the fourth plane parallel to a plane of the substrate P-Sub 221. The first nanotube element NT211 is in electrical communication with the first active region, the second active region and the first reference line via electrical contacts CS253, CS254, and CS255 at the first (bottom) surface of NT211. In the example of FIG. 1, the first nanotube element NT211 is in electrical communication with the first and second source regions 5223, 5224 (by virtue of conductive studs CS253 and CS255) and in electrical communication with the first reference line RL237 (by virtue of conductive stud CS254). As shown in FIG. 1, planes P1, P2, P3 and P4 are parallel to the plane of the substrate P-sub 221.

Figure 2:
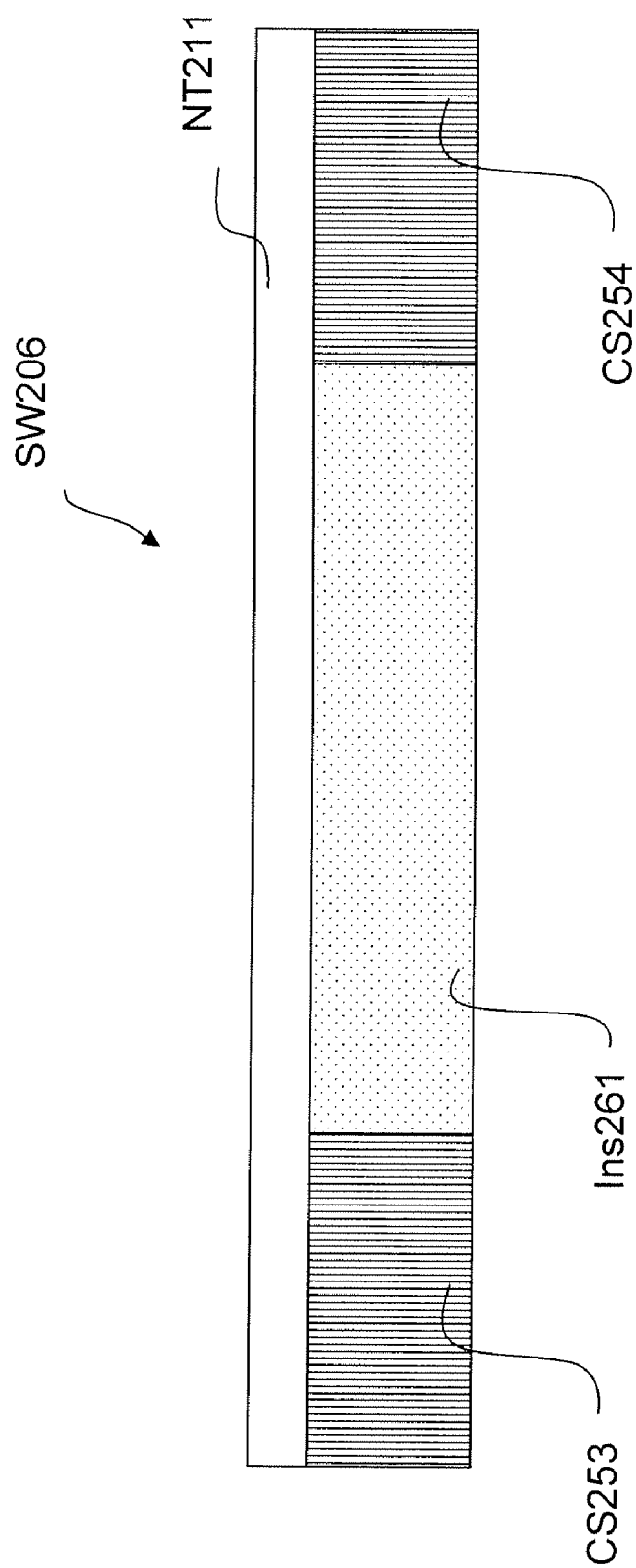
FIG. 2 schematically illustrates an expanded cross-sectional view of a portion of a switching device shown in FIG. 1.

In the example of FIG. 1, nanotube element NT211 is shared between switching devices 203 and 204 to provide a first region (switch SW206) and a second region (switch SW207) of nanotube element NT211, respectively. The first and second regions (SW206 and SW207) have resistance states that are independently adjustable in response to electrical stimuli and nonvolatilely retain those resistance states. FIG. 2 shows an expanded view of switch SW206 of switching device 203 of FIG. 1. Switch SW206 is a two-terminal nanotube switch that includes a portion of nanotube element NT211, and first and second conductive terminals CS253 and CS254, which are spaced apart by insulator Ins261. Insulator Ins261 can support nanotube element NT211 between terminals CS253 and CS254, passivate NT211 and/or to inhibit shorting between conductive terminals CS253 and CS254. Switch SW207 likewise is a two-terminal switch like switch SW206.

Like nanotube element NT211, nanotube elements NT212 and NT213 are positioned at an upper surface of electrical device 201, e.g., at an upper surface of the insulator Ins261. This positioning permits the nanotube elements NT211, NT212 and NT213 to be formed after the fabrication process of the underlying device structure (FETs, word lines, bit lines, reference lines, conductive studs, etc.) has already been completed. As such, the fabrication of the electrical device 201 is highly compatible with conventional semiconductor processing since the nanotube elements need not be introduced until a late stage in the device fabrication process.

In exemplary embodiments, nanotube element NT211 (and other nanotube elements described herein) can comprise a nanotube fabric that is disposed directly on conductive terminals CS253 and CS254 and insulator Ins261. That is, nanotube element NT211 includes a plurality of nanotubes that collectively form a conductive network between terminals CS253 and CS254. The resistance of nanotube element NT211 is based on, among other things, the contact resistance between the nanotubes of nanotube element NT211 and terminals CS253 and CS254, the inherent resistance of the nanotubes, and the number of conductive pathways that the nanotube element provides between terminals CS253 and CS254. Nanotube element NT211 can be substantially a monolayer of nanotubes, or can be a multilayer of nanotubes, for example. The formation of such nanotube fabrics, including processing for inclusion in CMOS-type electronic devices, is described in U.S. Pat. Nos. 6,835,591 and 7,566,478, the entire contents of each of which are incorporated herein by reference.

As fabricated, nanotube element NT211 may have a relatively low resistance, corresponding to a relatively large number of conductive pathways that the element provides between terminals CS253 and CS254. However, the resistance state of nanotube element NT211 can be controllably adjusted by applying appropriate electrical stimulus (e.g., voltages) to terminals CS253 and CS254. Once adjusted to a particular value, the resistance state of nanotube element NT211 nonvolatilely retains that value until it is subsequently adjusted to a higher or lower resistance by applying another appropriate electrical stimulus to terminals CS253 and CS254. The resistance state of nanotube element NT211 can readily be measured via conductive terminals CS253 and CS254 without changing the resistance (i.e., measured non-destructively), and the different measured resistance states can be assigned to corresponding informational (memory) states of switch SW206. For example, the resistance can be controllably and reversibly adjusted between two states for digital logic—a relatively low resistance state, assigned to a digital information state "1," and a relatively high resistance state, assigned to a digital information state "0." Or, for example, the nanotube element NT211 can retain more than two multi-resistance states used to represent multiple-bit logic states programmed using the same nanotube element NT211. For example, one low resistance state, two intermediate resistance states, and one high resistance state can be used to store two bits, represented as logical 00, logical 01, logical 10, and logical 11 states. In yet another example, one low resistance state, six intermediate resistance states, and one high resistance state can be used to represent three bits, and so on. Further details on the fabrication and programming of two-terminal nanotube switches may be found, for example, in U.S. Patent Application Publication Nos. 2008/0012047, 2008/0159042, and 2008/0158936, the entire contents of each of which are incorporated by reference herein. The description of nanotube element NT211 provided above is likewise applicable to nanotube elements NT212 and NT213 shown in FIG. 1 and other nanotube elements described herein.

By way of example, erase voltages (erase refers to low-to-high resistance transition) are typically in the 5-6 volts for nanotube element channel lengths (separation between lateral contacts of <=100 nm) with erase currents less than 20 uA. Programming voltages (program refers to high-to-low resistance transitions) are typically in the 3-5 volt range with programming currents less than 20 uA. Readouts of the resistance state of nanotube elements typically use no more than 2 volts with currents less than a few micro-Amperes. One or more erase or programming pulses may be used to achieve a desired resistance value and a read operation may be used to verify the resistance value of the nanotube element after a program or erase operation.

Resistance ranges for nanotube elements may be in the range of 100 kΩ to 100 MΩ so the high resistance value may greater than the low resistance value by 1,000 times. Nanotube films with resistance values as low as 10 kΩ and as high as >1 GΩ have been fabricated for a high to low resistance ratio of 100,000/1. The high to low resistance operating range enables multiple resistance value storage as described further above. For example, low resistance may be selected as nanotube elements having a resistance <150 kΩ; a first intermediate resistance range may be selected as 150 kΩ to 250 kΩ; a second intermediate resistance range may be selected as 250 kΩ to 1 MΩ, and the highest resistance range may be selected as >1 MΩ. In this example, two bits of information may be stored on a single nanotube element. Current or voltage sense amplifiers may be used to sense the resistance range of a particular bit as is well known in the art.

As shown in FIGS. 1 and 2, the nanotube element NT211 extends laterally in the fourth plane P4 parallel to a plane of the substrate. As such the current path through the first region SW206 of the nanotube element NT211 extends laterally in the fourth plane as well. That is, current from reference line RL237 to source S224, or vice versa, that provides for adjusting the resistance state, or for reading the resistance state value of the nanotube element NT211, follows a current path through the nanotube element NT211 that extends laterally through the nanotube element NT211 in the fourth plane parallel to the plane of the substrate. Similarly, a current path through the second region SW207 of the nanotube element extends laterally in the fourth plane. The nanotube element 211 can thereby form a two-dimensional non-volatile switch that is positioned in a layer (e.g., layer P4) that is parallel to an underlying layer of the device 201 (e.g., layer P3, P2 or P1). The nanotube element NT211 may include, for example, single wall nanotubes (SWNTs), double wall nanotubes (DWNTs), multiwall nanotubes (MWNTs), or various combinations of SWNTs, DWNTs, and MWNTs, and the nanotube element itself may include one layer of nanotubes or multiple layers of nanotubes. A first adjustable-resistance region SW206 of nanotube element NT211 may be formed by the separation (spacing) between a first contact (e.g., CS253) and a second contact (e.g., CS254), and a second adjustable-resistance region SW207 of nanotube element NT211 may be formed by the separation (spacing) between a third contact (e.g., CS 255) and the second contact (e.g., CS254).

Referring again to FIG. 1, switching devices 202 and 205 are constructed analogously to switching devices 203 and 204. In particular, switching device 202, shown in partial cross section in FIG. 1, is constructed like switching device 204 and includes a nanotube element NT212 disposed at an upper surface of insulator Ins261. Nanotube element NT212 is in electrical communication with source region S228 by virtue of conductive stud CS251. Switching device 205, shown in partial cross section in FIG. 1, is constructed like switching device 203. In particular, switching device 205, shown in partial cross section in FIG. 1, is constructed like switching device 203 and includes a nanotube element NT213 disposed at an upper surface of insulator Ins261. Nanotube element NT213 is in electrical communication with source region S227 by virtue of conductive stud CS257.

Referring to switching device 203 of electrical device 201 shown in FIG. 1, FET active area SDFET241, which is formed in substrate P-Sub 221, includes drain region D222, source region S224, and channel region C226a disposed therebetween. Word line WL231 is disposed over channel region C226a, and when activated enables the flow of current through channel region C226a, between source S224 and drain D222. In this example, bit line BL235 is arranged perpendicular to word line WL233 (the cross section of FIG. 1 being at an angle to both), and bit line BL235 is in electrical communication with drain D222 via conductive stud CS252. A first region (SW206) of nanotube element NT211 is in electrical communication with source S224 via conductive stud CS253. Nanotube element NT211 is also in electrical communication with reference line RL237, which is arranged parallel to word line WL231 and perpendicular to BL235 in this example. Word line WL231 is located in a first plane P1 above the upper surface of substrate P-Sub 221; bit line BL235 is located in a second plane P2 above the first plane P1; reference line RL237 is located in a third plane P3, which is positioned above the first and second planes P1 and P2; and nanotube element NT211 is located in a fourth plane P4, which is positioned above planes P1, P2 and P3. Electrical device 201 could alternatively be constructed with reference line RL237 located in a plane over the fourth (nanotube element) plane P4. Additionally, reference line RL237 could alternatively be arranged, in plane P3, parallel to bit line BL235 and perpendicular to word line WL231, with a conductive stud providing electrical communication between reference line RL237 and nanotube element NT211.

Referring again to FIG. 1, by suitably controlling electrical stimuli (e.g., voltages) to bit line BL235 and word line WL231, the operation of transistor SDFET241 can be controlled. By appropriately controlling the operation of transistor SDFET241 and the electrical stimulus (e.g., voltage) of reference line RL237, the resistance state of SW206 (first region of nanotube element NT211) can be suitably controlled and sensed. By suitably controlling electrical stimuli (e.g., voltages) to bit line BL236 and word line WL232, the operation of transistor SDFET242 can be controlled. By appropriately controlling the operation of transistor SDFET242 and the electrical stimulus of reference line RL237, the resistance state of SW207 (second region of nanotube element NT211) can be suitably controlled and sensed.

For example, in switching device 203 (and similarly in other switching devices disclosed herein), nanotube element NT211, conductive stud CS254, and conductive stud CS253 provide a two-terminal nanotube switch SW206, the digital state of which is defined by the resistance state of nanotube element NT211, as mentioned above. An appropriate electrical stimulus to change the resistance state of nanotube element NT211, i.e., to "program" nanotube element NT211, can be applied to RL237 and CS253 as follows. Word line WL231 is activated, enabling current flow through channel C226a. A voltage difference, at an appropriate current, is then applied between bit line BL235 and RL237. This can be achieved, for example, by applying an appropriate "program" voltage and current to BL235 and holding reference line RL237 at ground. Alternatively, BL235 can be held at ground and an appropriate "program" voltage and current can be applied to reference line RL237. Either way, because channel C226a is open, conductive stud CS253 and RL237 (via conductive stud CS254) apply a sufficient voltage and current to change the resistance state of nanotube element NT211, which resistance state is retained even when power is removed from electrical device 201, i.e., the resistance state of nanotube element NT211 is retained in a nonvolatile manner. The resistance state can be changed by repeating the above steps, but using an appropriate "erase" voltage and current. The resistance state of nanotube element NT211 may be non-destructively read out by activating word line WL231 and applying a low "read" voltage and current to one of bit line BL235 and reference line RL237.

Thus, a resistance state of a first region (SW206) of the first nanotube element NT211 is independently adjustable in response to an electrical stimulus (e.g., voltage) on the first word line WL231 and at least one of the first bit line BL235 and the first reference line RL237, such that the first region (SW206) nonvolatilely retains the first resistance state. A resistance state of a second region (SW207) of the first nanotube element NT211 is also independently adjustable (i.e., independently of the resistance state of SW206) in response to an electrical stimulus (e.g., voltage) on the second word line WL232 and at least one of the second bit line BL236 and the first reference line RL237. The second region (SW207) nonvolatilely retains the second resistance state. This operation will be explained further below.

As noted above, the electrical device 201 can advantageously provide for certain "sharing" of electrical components between adjacent switching devices 202, 203, 204 and 205. For example, the drains of FETs and associated conductors can be shared between adjacent devices. Switching devices 204 and 205 share the drain portion of active area SDFET242, in particular shared drain D225, which is in electrical communication with bit line BL236 via conductive stud CS256. Conductive stud CS256 and bit line BL236 are also shared between devices 204 and 205. Likewise, switching devices 202 and 203 share the drain portion of active area SDFET241, in particular shared drain D222, which is in electrical communication with bit line BL235 via conductive stud CS252. Conductive stud CS252 and bit line BL235 are also shared between switching devices 202 and 203. Like conventional FETS, the "shared-drain" FETs SDFET241 and SDFET242 each include a source, a drain and a channel region therebetween. However, these FETs have been rotated as illustrated further below with respect to FIG. 4 to enable cells with nanotube elements to be placed above word and bit lines, which permits ease of processing and compactness while maintaining a dense $6F^2$ cell area.

Nanotube elements can also be shared between adjacent switching devices. As shown in FIG. 1, for example, adjacent switching devices 203 and 204 share nanotube element NT211, which is in electrical communication with three conductive elements: conductive stud CS253, reference line RL237 (via conductive stud CS254), and conductive stud CS255. In this way, reference line RL237 is also shared between adjacent switching devices 203 and 204. Likewise, nanotube element NT212 is shared between switching device 202 and an adjacent switching device (not shown, but like 203), and nanotube element NT213 is shared between switching device 205 and an adjacent switching device (not shown, but like 204). Thus, for example, switching device 203 shares some elements with adjacent device 202, and other elements with adjacent device 204, allowing each individual device to have a smaller footprint than if each device shared no components with adjacent devices.

The sharing of elements among adjacent devices not only provides ease of processing but also supports enhanced functionality. For example, even though nanotube element NT211 is shared between adjacent devices, portions of the same nanotube element NT211 associated with each device remain independently controllable. For example, the resistance state of nanotube element NT211 is independently adjustable both in a first region SW206, which is part of device 203, and in a second region SW207, which is part of device 204. The resistance state in first region SW206 is adjustable by applying an appropriate voltage and current to conductive studs CS253 and CS254. In one embodiment, reference line RL237 is held at ground, and word line WL231 is activated so channel C226a becomes conductive, providing a conductive pathway between bit line BL235 and conductive stud CS253. An appropriate voltage and current is applied to bit line BL235 to change the resistance of nanotube element NT211. Note, however, that because the voltage and current is applied between conductive stud CS253 and CS254, the resistance of nanotube element NT211 is changed in the region between those two elements, SW206. The resistance state of region SW207, which is part of device 204, can be independently adjusted by applying an appropriate voltage and current to conductive studs CS255 and CS253. In one embodiment, word line WL232 is activated so channel C229a becomes conductive, providing a conductive pathway between bit line BL236 and conductive stud CS255. An appropriate voltage and current is applied to bit line BL236 and reference line RL237 to change the resistance state of nanotube element NT211 in region SW207. Note that because devices 203 and 204 share nanotube element NT211, which can nonvolatilely store independently store different states in different of its regions, devices 203 and 204 can also be considered two portions of a single device.

In the plurality of devices illustrated in FIG. 1, the various components are positioned in planes that have specified relationships to the planes of other components. For example, the first, second, third, and fourth word lines WL231, WL232, WL233, and WL234 are positioned in a first plane P1 above the upper surface of the substrate. The first and second bit lines BL235, BL236 are positioned in a second plane P2 above the first plane. The reference line RL237 is positioned in a third plane P3 above the first and second planes. The first, second, and third nanotube elements NT211, NT212, and NT213 are positioned in a fourth plane P4 above the first, second, and third planes. As described in greater detail below, the reference lines (third plane) can be provided in a variety of positions. For example, the reference line RL237 can instead be positioned in a third plane above the first (word line) plane, but below the second (bit line) plane. Or, for example, the reference line RL237 can instead be positioned in a third plane above the fourth (nanotube element) plane.

Although FIG. 1 is illustrated with certain elements shared among the devices 202-205, the elements need not necessarily be shared to achieve a similar functionality. For example, devices 202 and 203 can be constructed so as to each have their own associated bit line, drain, and conductive stud therebetween, instead of sharing bit line BL253, shared drain D222, and conductive stud CS252. Similarly, devices 203 and 204 can be constructed so as to each have their own release line and conductive stud between the nanotube element and release line, instead of sharing release line RL237 and conductive stud CS254. Additionally, devices 203 and 204 need not necessarily share nanotube element NT211, but could instead be constructed so as to each have their own nanotube element. However, the overall footprint of each device may be increased relative to devices that share the elements, because additional space would be required for the additional elements.

FIGS. 3A-3E illustrate a plurality of devices 301 in which nanotube elements, reference lines, and/or drains are shared among adjacent devices, the nanotube elements are positioned in a plane above the bit line plane, and in which the word lines, bit lines, and the active areas of the shared-drain FETs are arranged at specified angles relative to one another, allowing for a further reduction in device size.

Figure 3A:
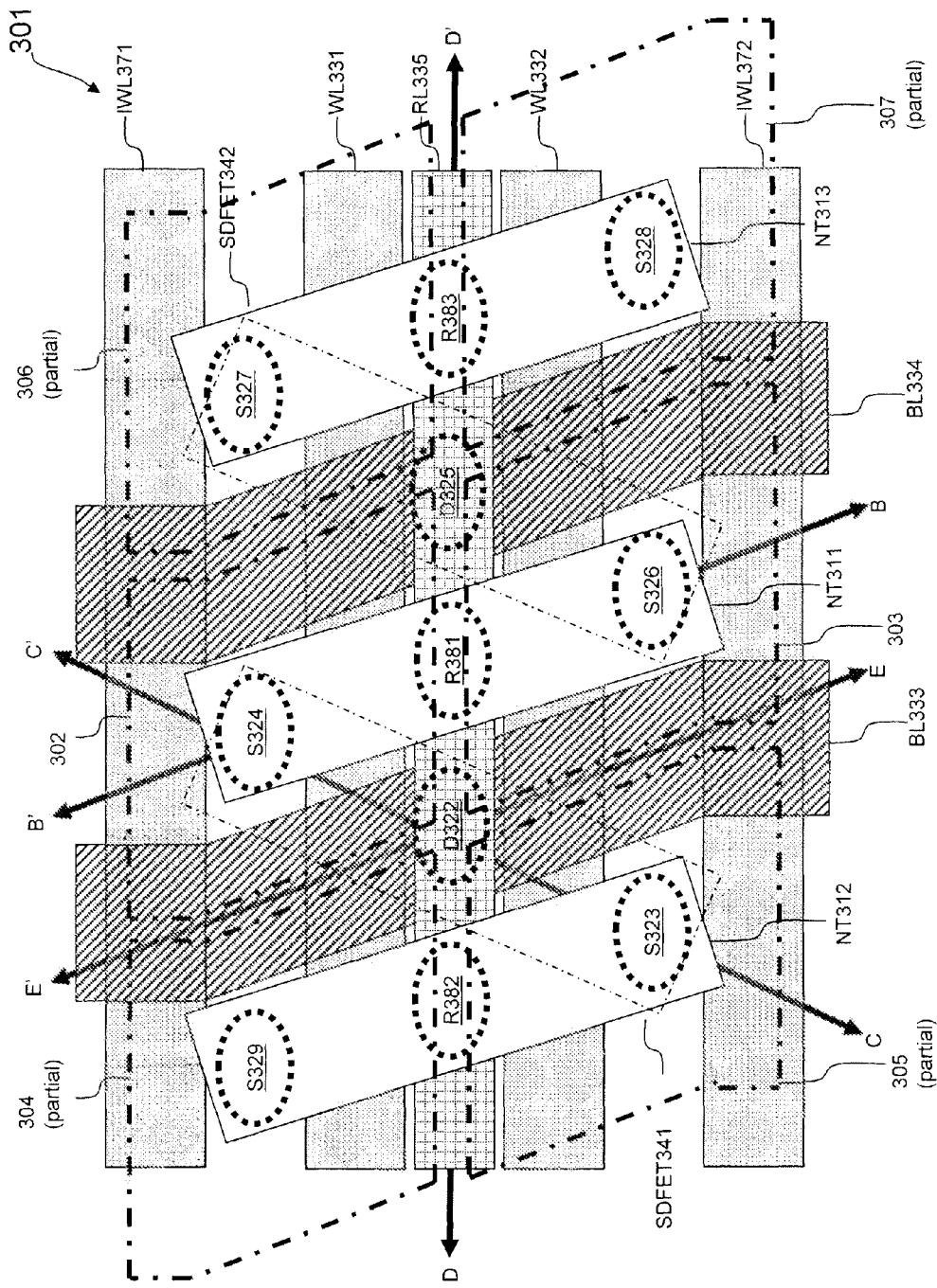
FIG. 3A schematically illustrates a plan view of a plurality of switching devices with nanotube elements in a plane above the bit line plane and with certain elements shared among the devices, according to exemplary embodiments.

Referring to the plan view shown in FIG. 3A, the plurality of devices 301 include first and second shared-drain FET active areas SDFET341, SDFET342 in the substrate (not shown in FIG. 3A); first and second word lines WL331, WL332; first and second bit lines BL333, BL334; a reference line RL335; first, second, and third nanotube elements NT311, NT312, NT313; and first and second isolation word lines IWL371, IWL372. First SDFET341 includes a first shared drain region D322 and first and second source regions S323, S324, and second SDFET342 includes a second shared drain region D325 and third and fourth source regions S326, S327. Source regions S328 and S329 are part of other shared-drain FET active areas, not illustrated. For the sake of simplicity, channel regions between respective drain and source regions are not illustrated in FIG. 3A.

The plurality of devices 301 includes a plurality of devices 302, 303, 304, 305, 306, and 307. In the illustrated view, cells 304, 305, 306, and 307 are partially shown; however, cells 304 and 306 are constructed analogously to cell 302, and cells 305 and 307 are constructed analogously to cell 304. Adjacent devices 302 and 303 share the first nanotube element NT311, adjacent devices 304 and 305 share the second nanotube element NT312, and adjacent devices 306 and 307 share the third nanotube element NT313. Adjacent devices 302 and 305 share first SDFET341, and adjacent devices 303 and 306 share second SDFET342. Devices 302, 304, and 306 share first isolation word line IWL371, which is held at a reference voltage and inhibits the electric field of first word line WL331 from unintentionally modifying the conductivity of channels in other devices (not illustrated) of the plurality of devices 301. Devices 303, 305, and 307 share second isolation word line IWL372, which is held at a reference voltage and inhibits the electric field of second word line WL332 from unintentionally modifying the conductivity of channels in other devices (not illustrated) of the plurality of devices 301. Additionally, all of the devices 302-307 share reference line RL335. Specifically, adjacent devices 302 and 303 share a first connection to a first portion R381 of reference line RL335, adjacent devices 304 and 305 share a second connection to a second portion R382 of reference line RL335, and adjacent devices 306 and 307 share a third connection to a third portion R383 of reference line RL335.

Figure 3B:
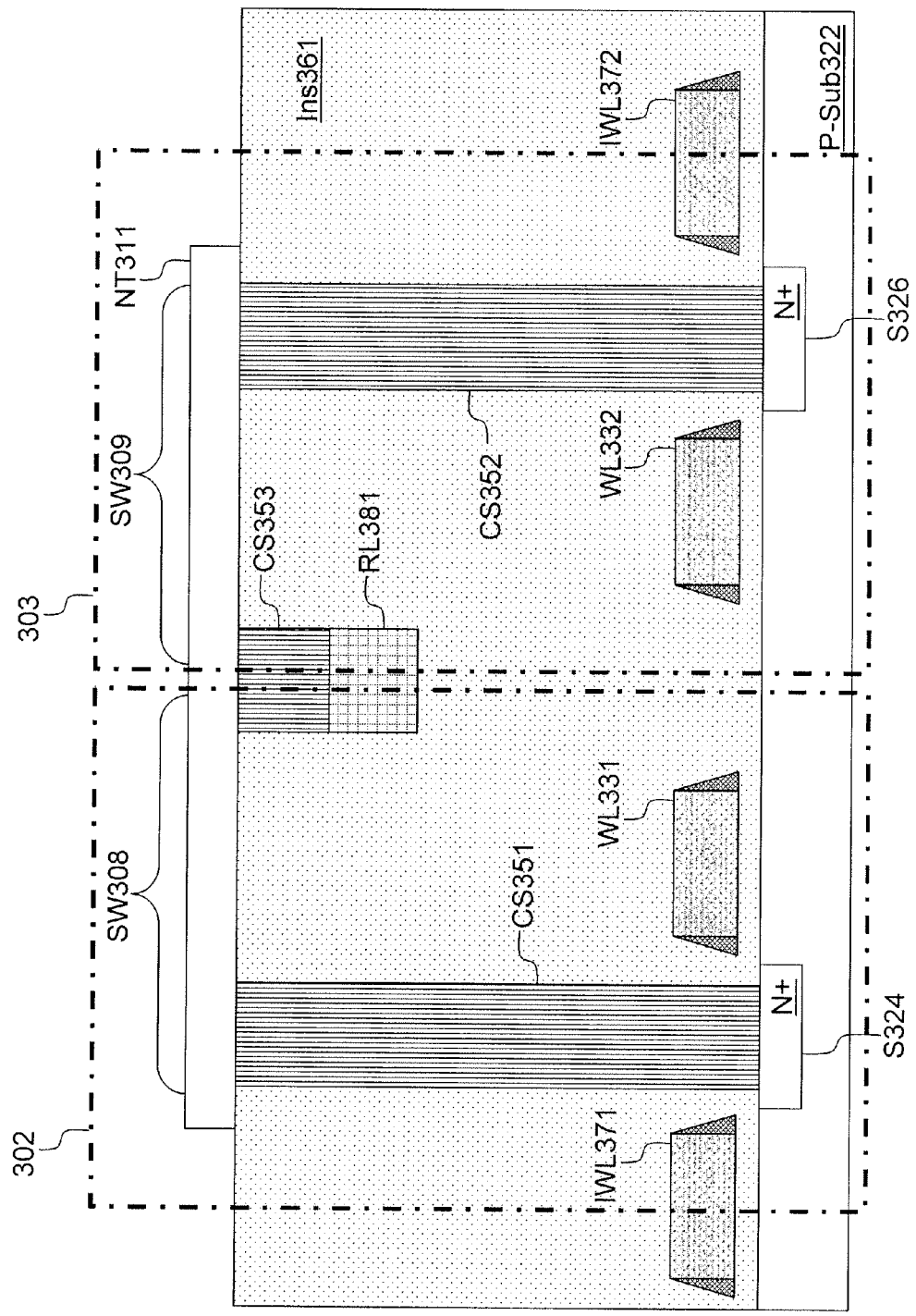
FIGS. 3B-3E schematically illustrate cross-sectional views of the plurality of devices of FIG. 3A, according to exemplary embodiments.

FIG. 3B illustrates a cross-section of the plurality of devices 301 along line B-B' of FIG. 3A. As shown in FIG. 3B, first and second word lines WL331 and WL332 are positioned in a first plane above the upper surface of substrate P-Sub322; however, neither the channels these word lines control, nor the bit lines, are visible in FIG. 3B. Insulator Ins361 supports and insulates the conductive elements, and can be any suitable material, such as those disclosed herein or as known in the art.

First nanotube element NT311, which is shared between devices 302, 303 is in electrical communication with source region S324, which is part of first SDFET341, via conductive stud CS351, and is also in electrical communication with source region S326, which is part of second SDFET342, via conductive stud CS352. First nanotube element NT311 is further in electrical communication with release line portion RL381, which is shared between devices 302, 303, via conductive stud CS353. For example, the resistance state of nanotube element NT311 is independently adjustable both in a first region SW308, which is part of device 302, and in a second region SW309, which is part of device 303, in a manner analogous to nanotube element NT211 discussed above with respect to FIG. 1. Specifically, the resistance state in first region SW308 is adjustable by applying an appropriate voltage and current to conductive studs CS351 and CS353, and the resistance state in second region SW309 is adjustable by applying an appropriate voltage and current to conductive studs CS352 and CS353, e.g., by activating the appropriate word line, bit line, and reference line for that device.

Figure 3C:
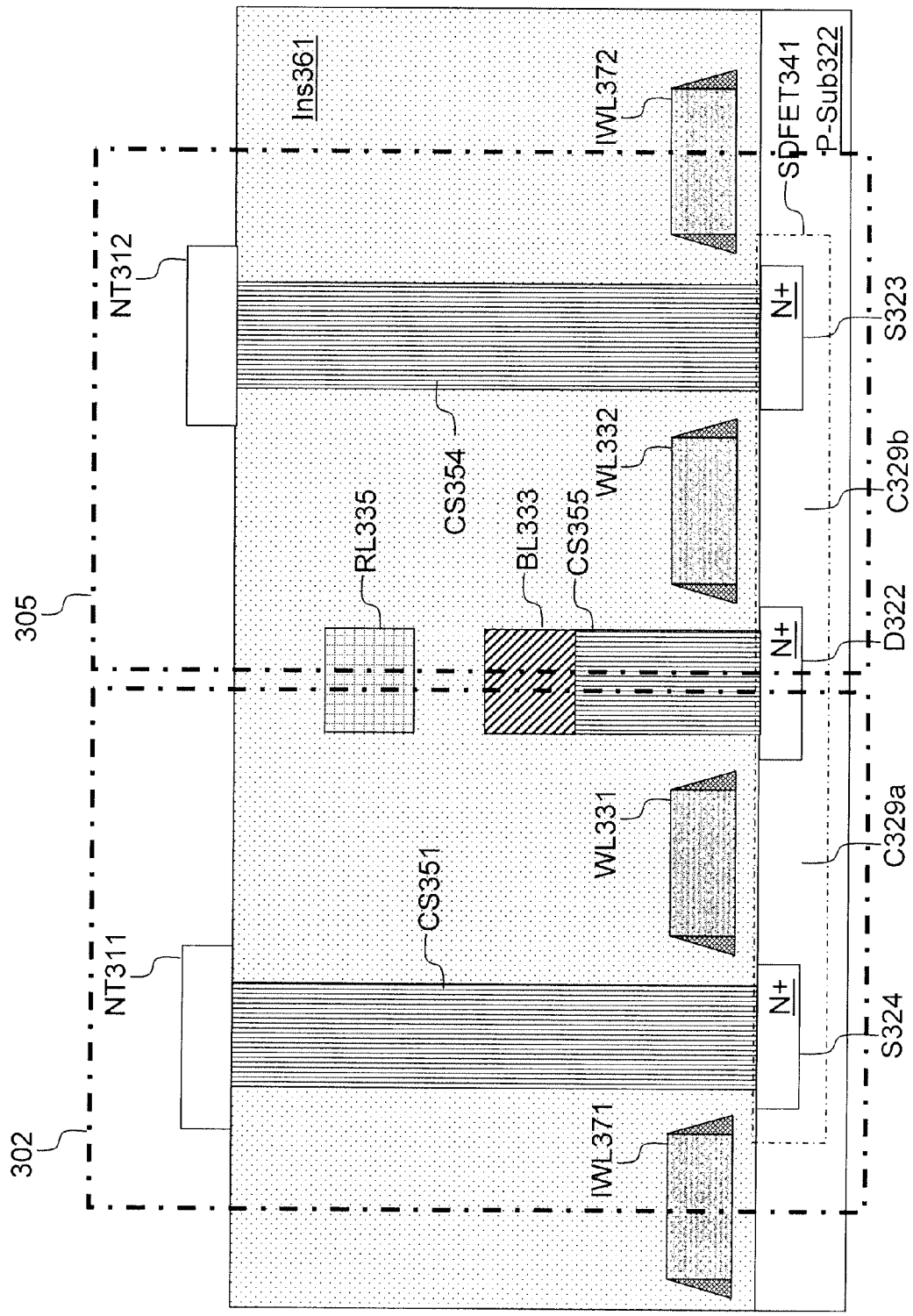

FIG. 3C illustrates a cross-section of the plurality of devices 301 along line C-C' of FIG. 3A. As shown in FIG. 3C, first SDFET341 includes sources S323 and S324, shared drain D322, and first and second channel regions C329$a$, C329$b$ over which first and second word lines WL331, WL332 are respectively positioned, analogously to SDFET241 of FIG. 1. First nanotube element NT311, which is part of device 302, is in electrical communication with source S324 via conductive stud CS351, and second nanotube element NT312, which is part of device 305, is in electrical communication with source S323 via conductive stud CS352. Bit line BL333, which is shared between devices 302 and 305, is in electrical communication with shared drain D322. Release line RL335 is visible in FIG. 3C, and its electrical connections to nanotube elements NT311, NT312 are illustrated in other drawings.

Figure 3D:
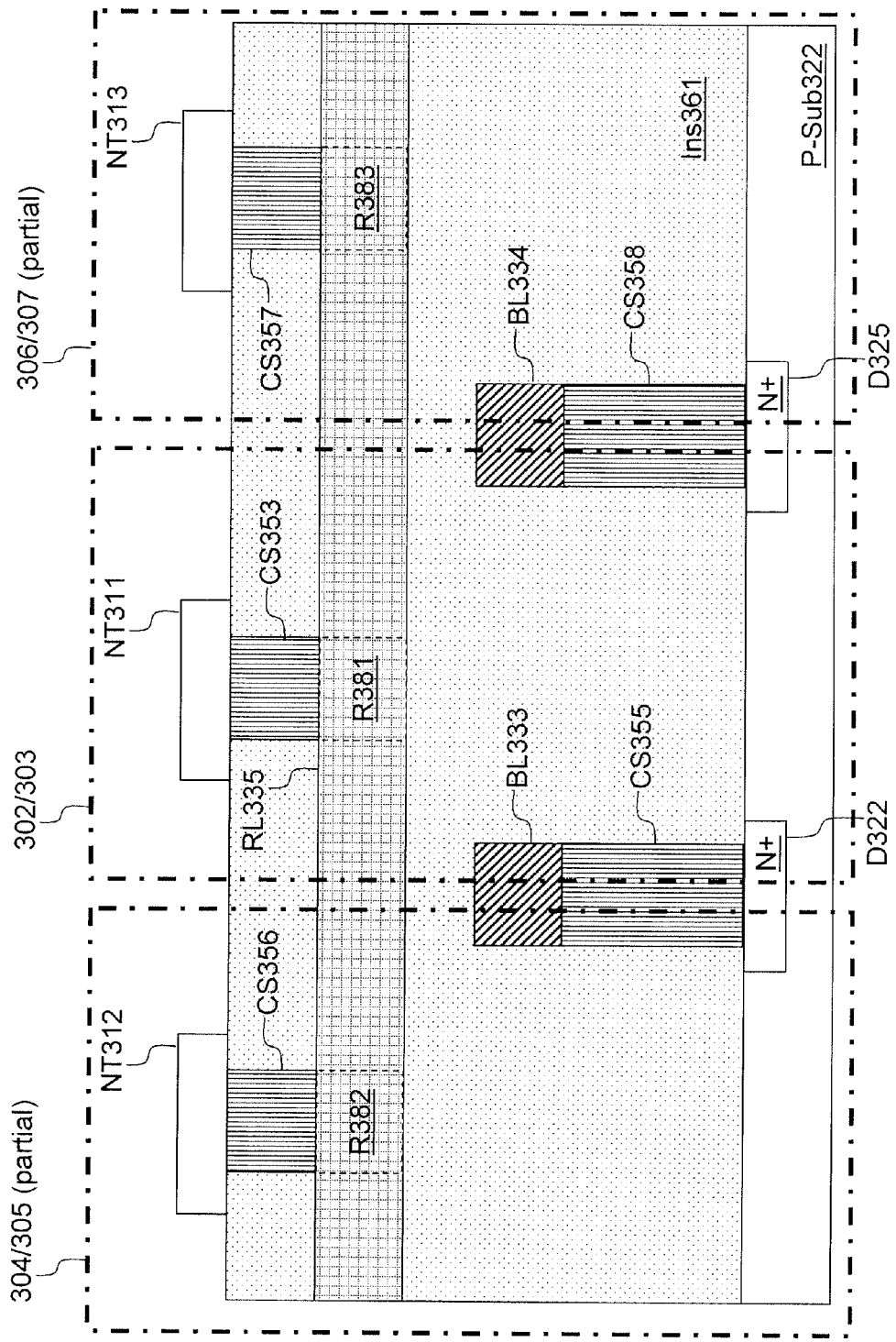

FIG. 3D illustrates a cross-section of the plurality of devices 301 along line D-D' of FIG. 3A. As shown in FIG. 3D, devices 302 and 303 share first nanotube element NT311 and its connection via conductive stud CS353 to first portion R381 of release line RL335; devices 304 and 305 share second nanotube element NT312 and its connection via conductive stud CS356 to second portion R382 of release line RL335; and devices 306 and 307 share third nanotube element NT313 and its connection via conductive stud CS357 to third portion R383 of release line RL335. Additionally, devices 302, 305 share first drain D322 and first bit line BL333, which are in electrical communication with conductive stud CS355; and devices 303, 306 share second drain D325 and second bit line BL334, which are in electrical communication with conductive stud CS358. Although devices 304 and 303 would appear from FIG. 3D to also share first drain D322, device 304 instead shares a drain with a different adjacent device (not illustrated in FIGS. 3A-3E), and device 303 shares second drain D322 with device 306. Similarly, although devices 302 and 307 would appear from FIG. 3D to also share second drain D323, device 302 instead shares a drain with device 305, and device 307 shares a drain with a different adjacent device (not illustrated in FIGS. 3A-3E).

Figure 3E:
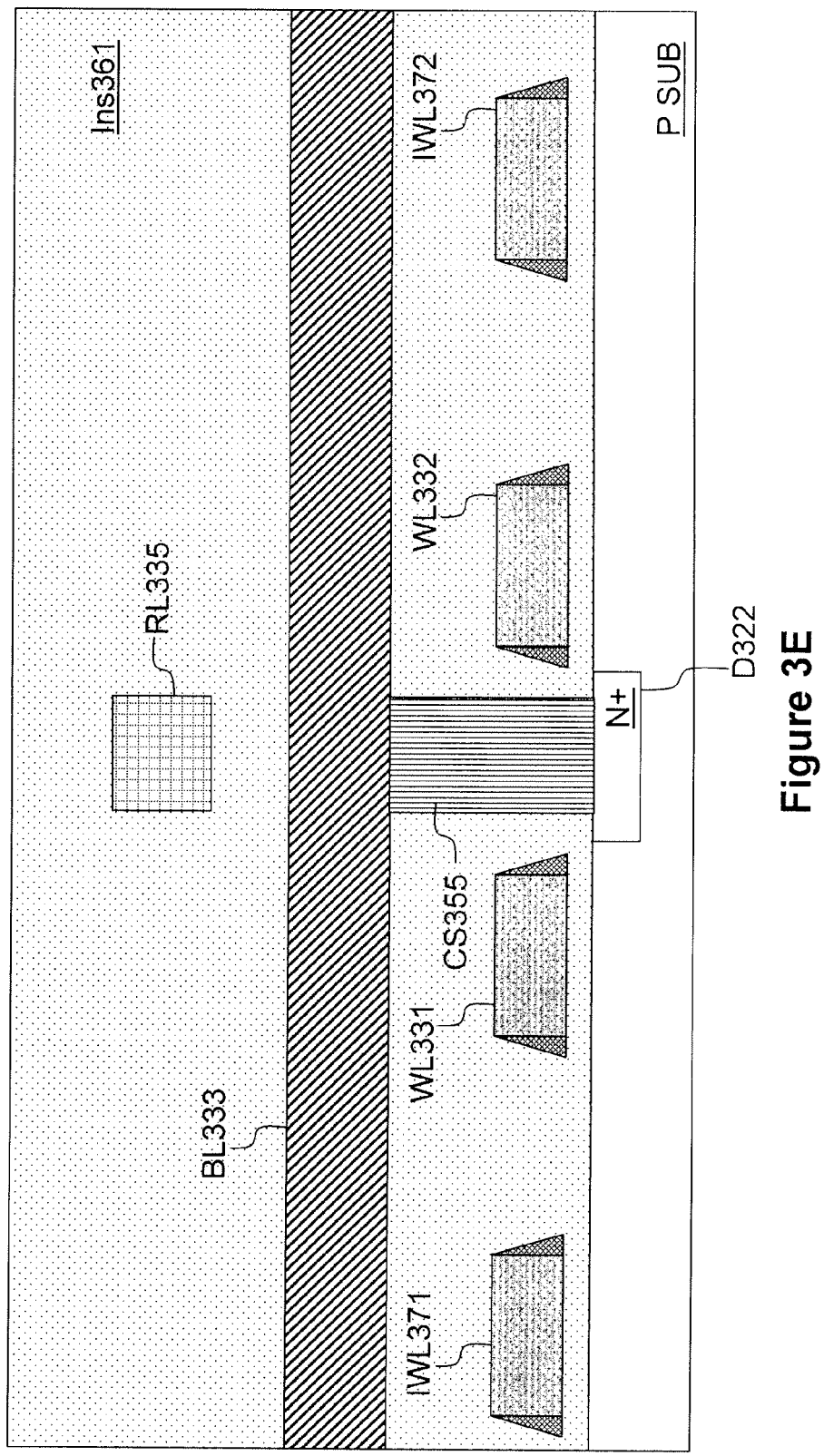

FIG. 3E illustrates a cross-section of the plurality of devices 301 along line E-E' of FIG. 3A. As shown in FIG. 3E, bit line is in electrical communication with shared drain D322 of SDFET341 via conductive stud CS355, is positioned in a plane above the word line plane in which first and second word lines WL331, WL332 and the first and second isolation word lines IWL371, IWL372 are positioned. Release line RL335 is positioned in a plane above the bit line and word line planes, although, as described below, the release line plane can optionally be positioned elsewhere in the devices. Other alternative configurations for the plurality of devices are also described below.

Figure 4A:
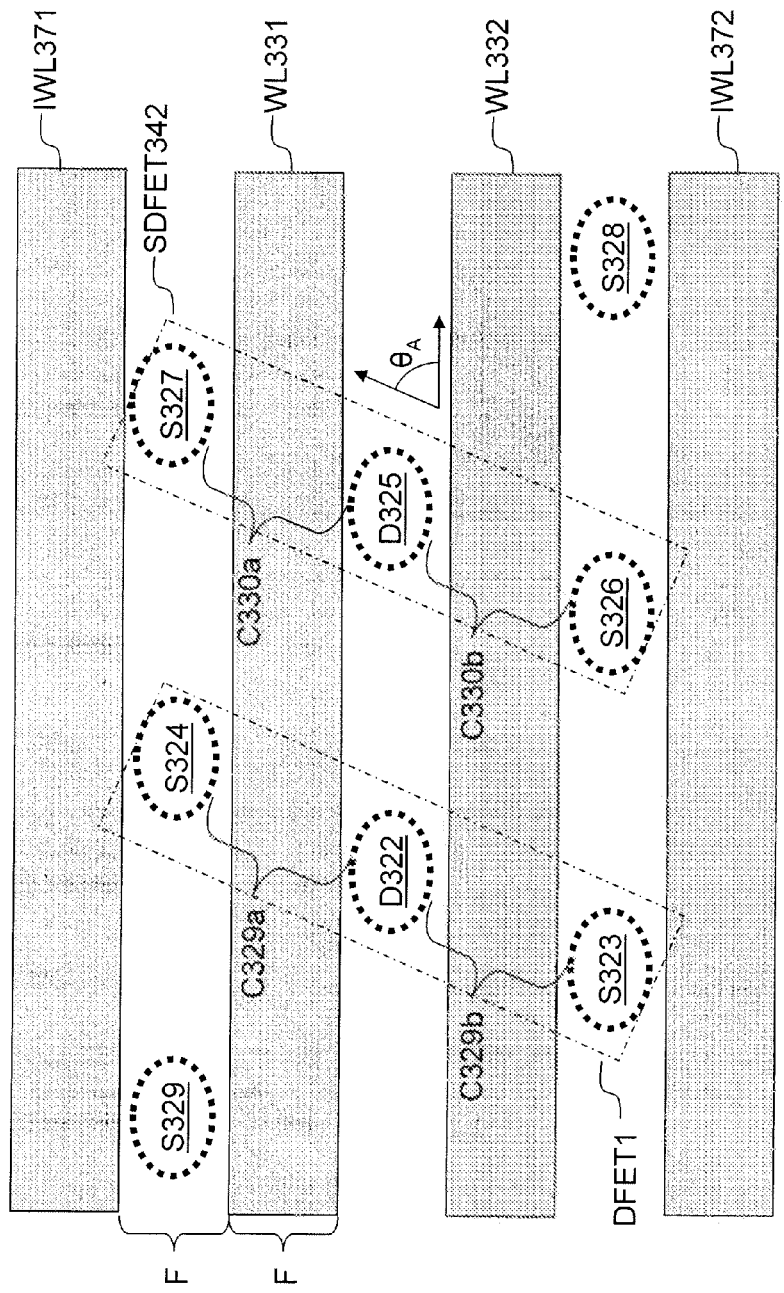
FIGS. 4A-4B schematically illustrate plan views of one exemplary arrangement of elements in a plurality of switching devices.

In the embodiments illustrated in FIGS. 3A-3E, the size of each individual device is reduced not only by sharing certain elements among the devices 301-307, but also by arranging the word lines, bit lines, reference line, shared-drain field effect device active areas, and/or nanotube elements at specified angles to one another. Specifically, as illustrated in FIG. 4A, word lines WL331, WL332 are arranged substantially parallel to each other and to isolation word lines IWL371, IWL372. The size of, and spacing between, the word lines and isolation word lines is greater than or equal to the minimum fabrication dimension F, well understood in the art to refer to the nominal dimension of minimum features in a device, for a given process generation. As an illustration, one example of a minimum fabrication dimension is F=90 nm, for the 90 nm technology node as defined by the International Technology Roadmap for semiconductors. This example should not be construed as limiting, because the F dimension is defined by the particular fabrication instruments and process generation.

Figure 4B:
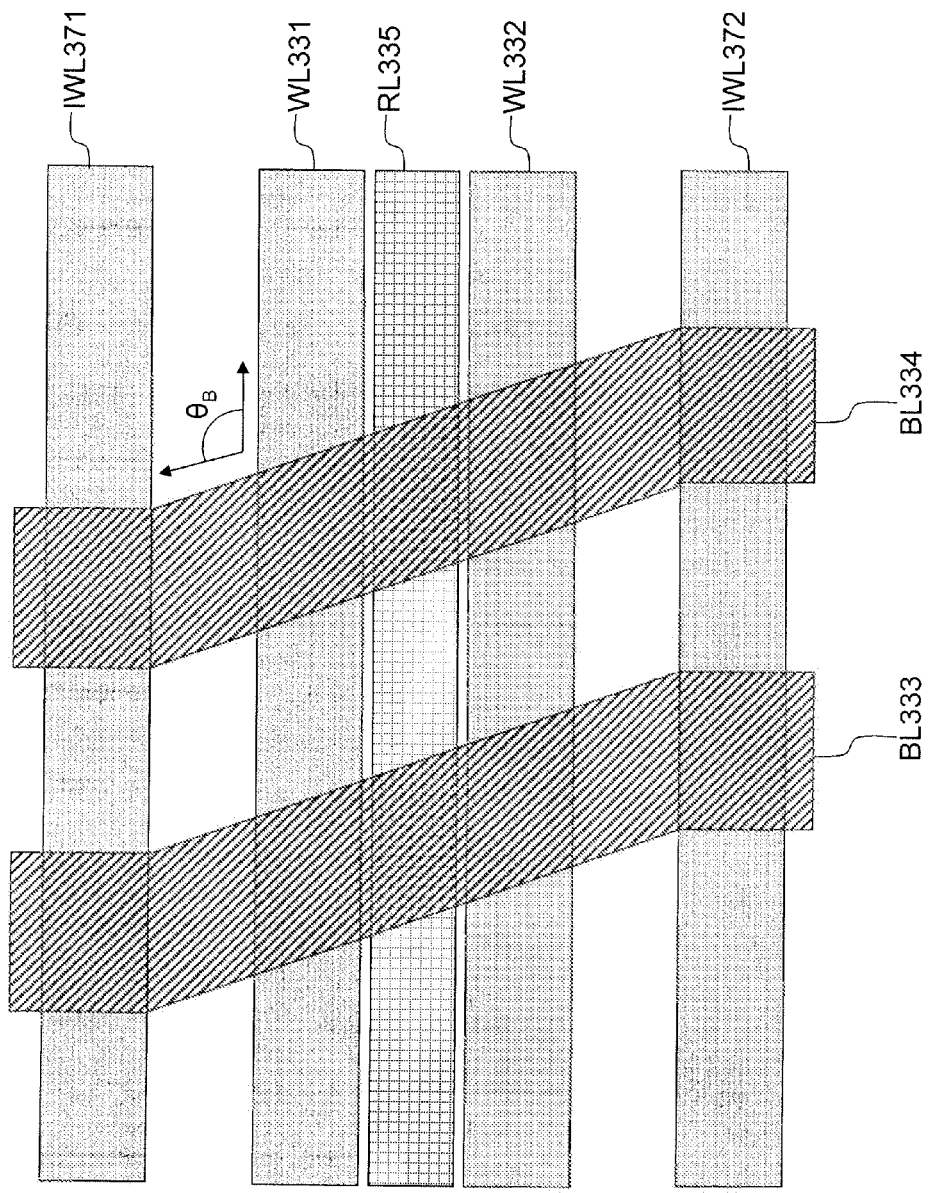

Shared-drain FET active areas SDFET341, SDFET342 are arranged parallel to one another and cross word lines WL331, WL332 at an angle $\Theta_A$. Angle $\Theta_A$ can vary between a variety of acute angles, or can be 90°. Additionally, as illustrated in FIG. 4B, bit lines BL333, BL334 are arranged substantially parallel to each other along their length, and cross word lines WL331, WL332, and reference line RL335 at an angle $\Theta_B$. Angle $\Theta_B$ can vary between a variety of obtuse angles, or can be 90°. In one embodiment, angle $\Theta_A$ is approximately 76°, and angle $\Theta_B$ is approximately 104°, which results in devices having a footprint of approximately $6F^2$. Other angles, and other device footprints, can also be used. Additionally, as described below, the reference line RL335 need not necessarily cross the bit lines at angle $\Theta_B$, but can take a variety of configurations. Similarly, although in some embodiments the nanotube elements NT311, NT312, NT313 are arranged parallel to at least a portion of the word lines, also at an angle $\Theta_B$ relative to the word lines, the nanotube elements can take a variety of configurations, some of which are described below.

Shared-drain FET active areas SDFET341, SDFET342 have been rotated to the right relative to the vertical direction so that corresponding FETs devices formed in the active areas are rotated to the right. Corresponding bit lines BL333, BL334 are rotated to the left of the vertical direction. In this way, a sufficiently large region is generated which enables a vertical via to connect a source diffusion for each FET to a corresponding nanotube element formed above the bit line without shorting the vertical via to the bit line, thereby enabling nanotube elements to be placed above word and bit lines, which permits ease of processing and compactness while maintaining a dense $6F^2$ cell area.

Figure 5A:
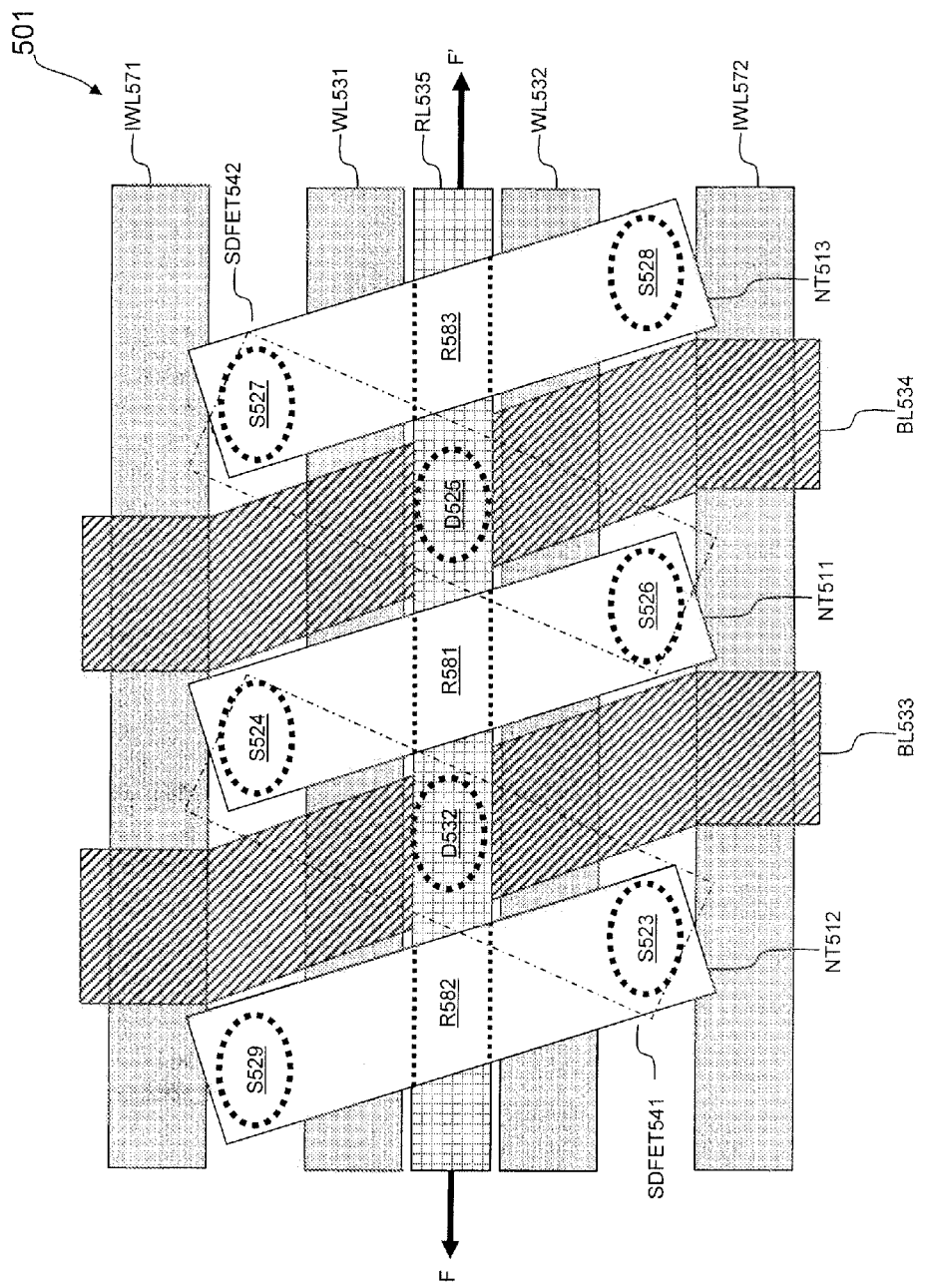
FIGS. 5A-5B schematically illustrate plan and cross-sectional views, respectively, of an alternative arrangement of switching devices, according to exemplary embodiments.
Figure 5B:
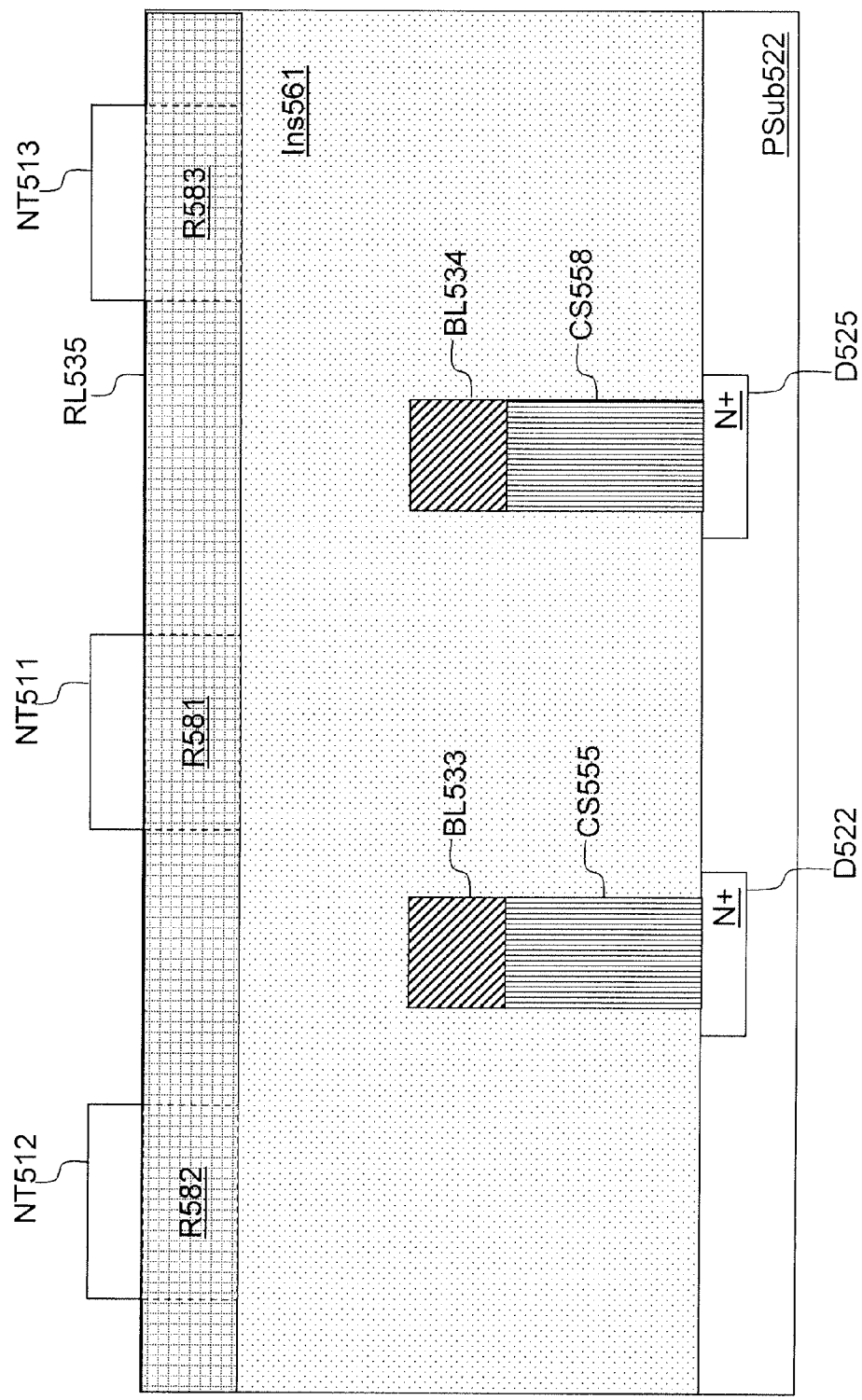

In one alternative configuration, conductive studs to provide electrical communication between the nanotube elements and the release line are omitted, and the nanotube elements instead are placed directly in physical, and electrical, contact with the reference line, as illustrated in FIGS. 5A-5B. As illustrated in FIG. 5A, plurality of devices 501 is for the most part arranged analogously to devices 301 of FIG. 3A. For example, the plurality of devices includes first and second shared-drain FETs SDFET541, SDFET542; first and second word lines WL531, WL532 positioned over respective channels (not shown) of SDFET541, SDFET542; and first and second bit lines BL533, BL534 in respective electrical communication with shared drain region D532 of SDFET541 and shared drain region D525 of SDFET542. Like devices 301, devices 501 also include first, second, and third nanotube elements NT511, NT512, NT513. However, unlike devices 301, the nanotube elements are instead positioned in direct physical and electrical contact with reference line RL535. Specifically, first nanotube element NT511 contacts the upper surface of reference line first region R582, second nanotube element NT512 contacts the upper surface of reference line second region R582, and third nanotube element NT513 contacts the upper surface of reference line third region R583. FIG. 5B illustrates a cross-sectional view of devices 501 along line F-F', in which the respective direct physical contact between nanotube elements NT511, NT512, NT513 and reference line regions R581, R582, R583 can be seen. Such a configuration can be useful because steps for providing conductive studs between the nanotube elements and reference line can be omitted, simplifying the fabrication process.

Figure 6A:
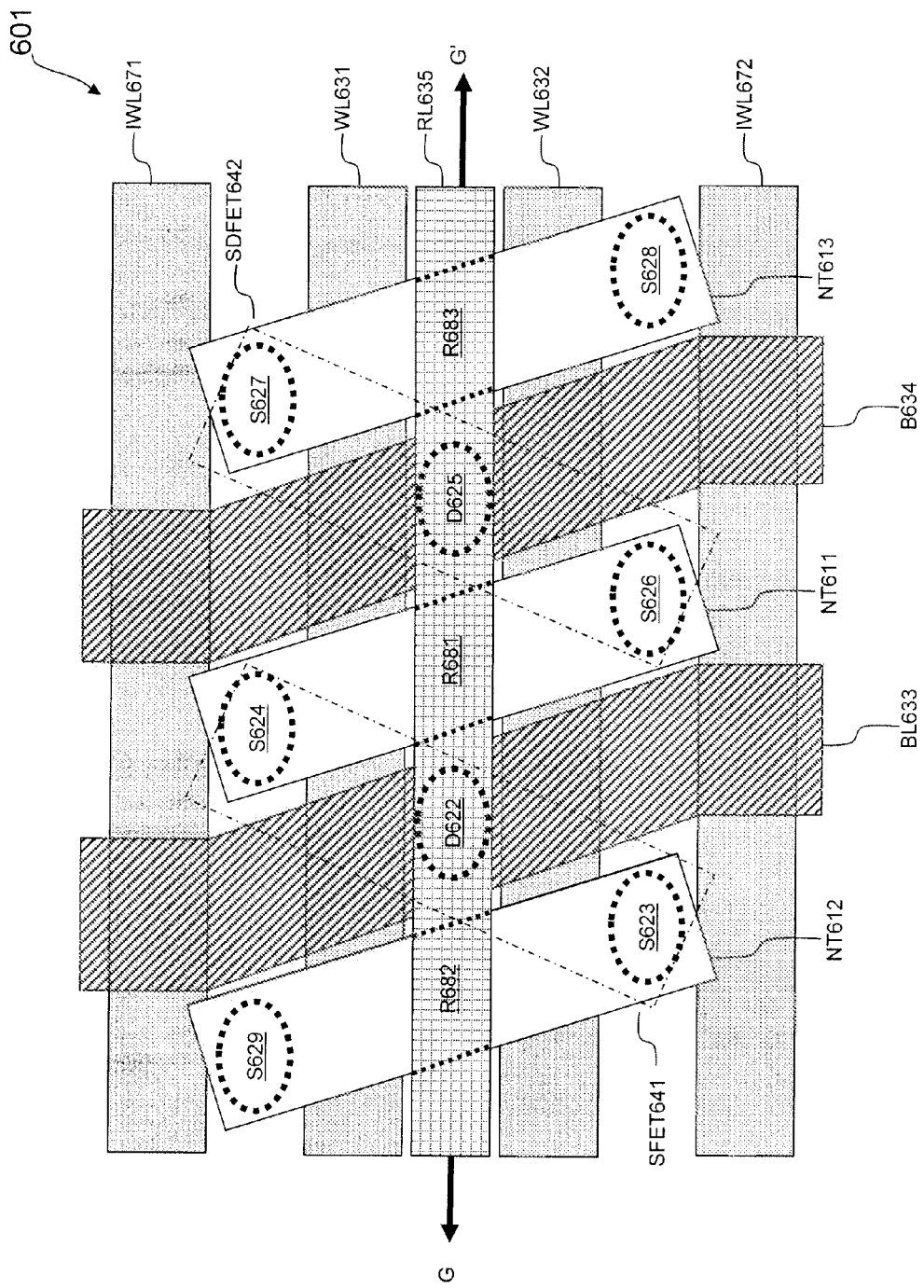
FIGS. 6A-6B schematically illustrate plan and cross-sectional views, respectively, of an alternative arrangement of switching devices, according to exemplary embodiments.
Figure 6B:
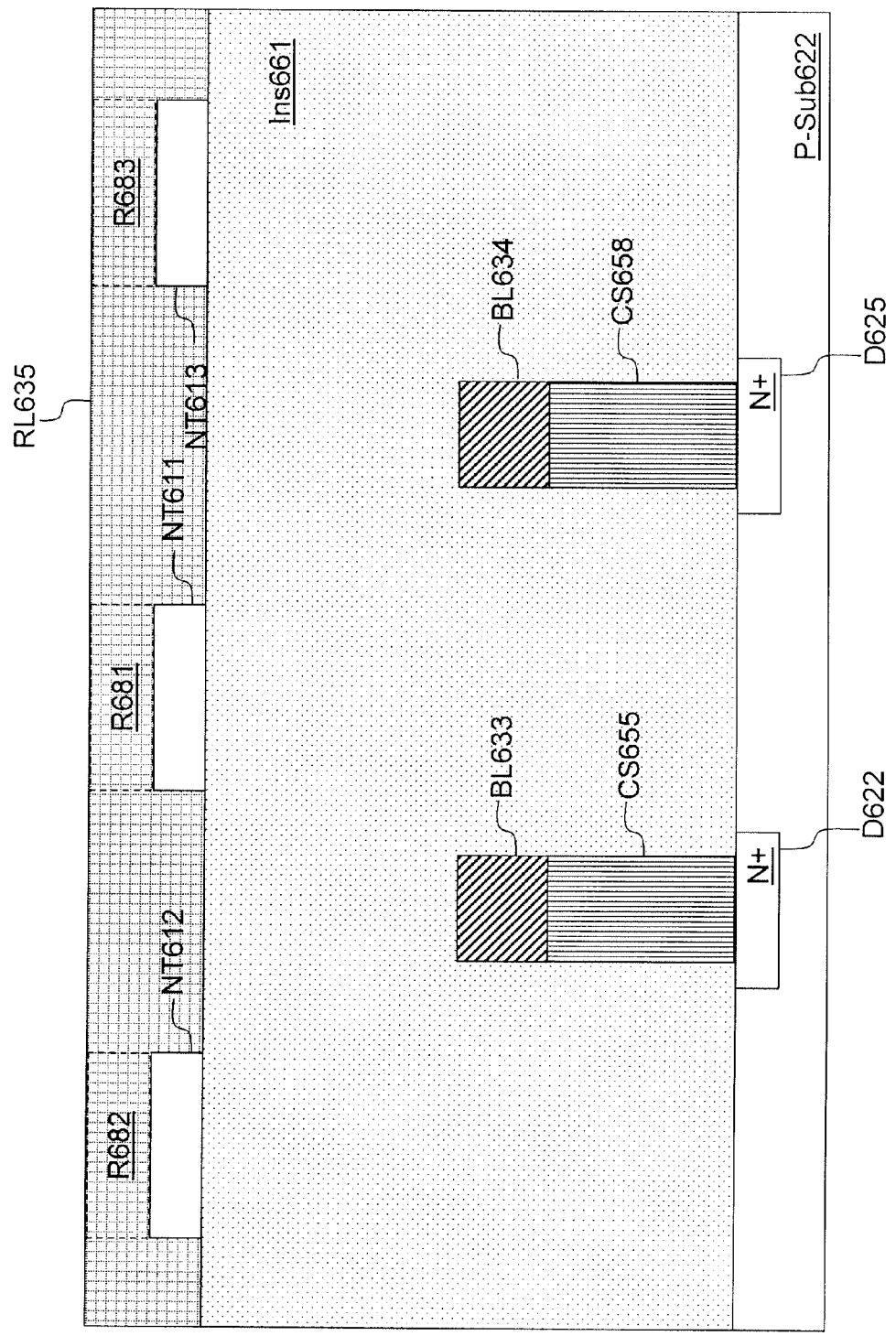

In another alternative configuration, the release line is deposited directly onto the nanotube elements, as illustrated in FIGS. 6A-6B. As illustrated in FIG. 6A, plurality of devices 601 is for the most part arranged analogously to devices 301 of FIG. 3A. For example, the plurality of devices includes first and second shared-drain FETs SDFET641, SDFET642; first and second word lines WL631, WL632 positioned over respective channels (not shown) of SDFET641, SDFET642; and first and second bit lines BL633, BL634 in respective electrical communication with shared drain region D632 of SDFET641 and shared drain region D625 of SDFET642. Like devices 301, devices 601 also include first, second, and third nanotube elements NT611, NT612, NT613. However, unlike devices 301, the reference line RL635 is deposited directly on top of, and in direct physical and electrical contact with, the nanotube elements. Specifically, the first reference line region R681 contacts the upper surface of first nanotube element NT611, the second reference line region R682 contacts the upper surface of second nanotube element NT612, and the third reference line region R683 contacts the upper surface of third nanotube element NT613. FIG. 6B illustrates a cross-sectional view of devices 601 along line G-G', in which the respective direct physical contact between nanotube elements NT611, NT612, NT613 and reference line regions R681, R682, R683 can be seen. Reference line RL635 also fills the spaces between the nanotube elements. Like the embodiment illustrated in FIGS. 5A-5B, such a configuration can be useful because steps for providing conductive studs between the nanotube elements and reference line can be omitted, simplifying the fabrication process. In another alternative embodiment (not illustrated), the reference line is positioned in a plane above the nanotube element plane, and is in electrical communication with the nanotube elements via conductive studs.

In another alternative configuration, the release line is deposited directly onto, and crossing, the nanotube elements, as illustrated in FIGS. 6A-6B. As illustrated in FIG. 6A, plurality of devices 601 is for the most part arranged analogously to devices 301 of FIG. 3A. For example, the plurality of devices includes first and second shared-drain FETs SDFET641, SDFET642; first and second word lines WL631, WL632 positioned over respective channels (not shown) of SDFET641, SDFET642; and first and second bit lines BL633, BL634 in respective electrical communication with shared drain region D632 of SDFET641 and shared drain region D625 of SDFET642. Like devices 301, devices 601 also include first, second, and third nanotube elements NT611, NT612, NT613. However, unlike devices 301, the reference line RL635 is deposited directly on top of, and in direct physical and electrical contact with, the nanotube elements. Specifically, the first reference line region R681 contacts the upper surface of first nanotube element NT611, the second reference line region R682 contacts the upper surface of second nanotube element NT612, and the third reference line region R683 contacts the upper surface of third nanotube element NT613. FIG. 6B illustrates a cross-sectional view of devices 601 along line G-G', in which the respective direct physical contact between nanotube elements NT611, NT612, NT613 and reference line regions R681, R682, R683 can be seen. Reference line RL635 also fills the spaces between the nanotube elements. Like the embodiment illustrated in FIGS. 5A-5B, such a configuration can be useful because steps for providing conductive studs between the nanotube elements and reference line can be omitted, simplifying the fabrication process. In another alternative embodiment (not illustrated), the reference line is positioned in a plane above the nanotube element plane, and is in electrical communication with the nanotube elements via conductive studs.

Figure 7A:
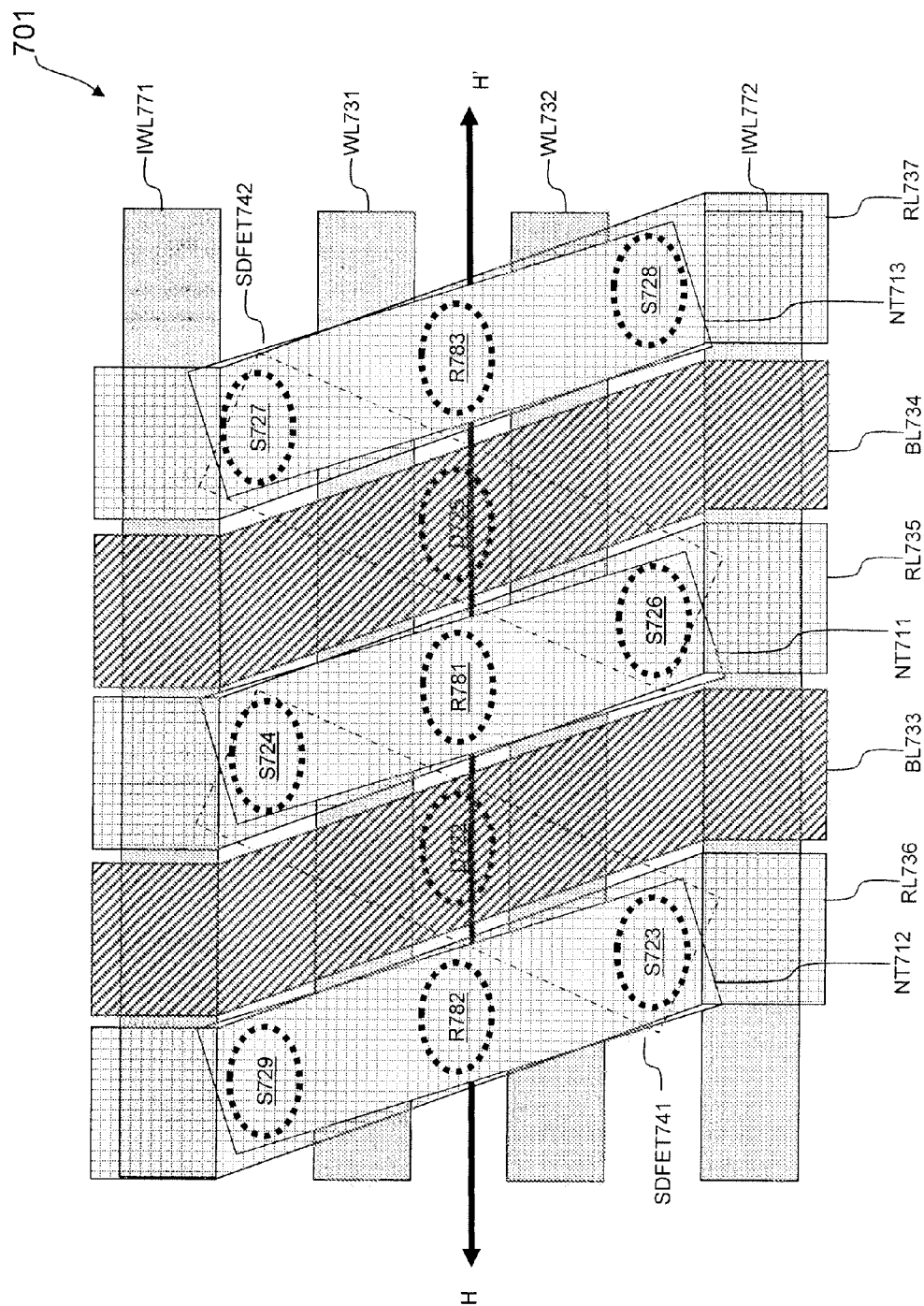
FIGS. 7A-7B schematically illustrate plan and cross-sectional views, respectively, of an alternative arrangement of switching devices, according to exemplary embodiments.
Figure 7B:
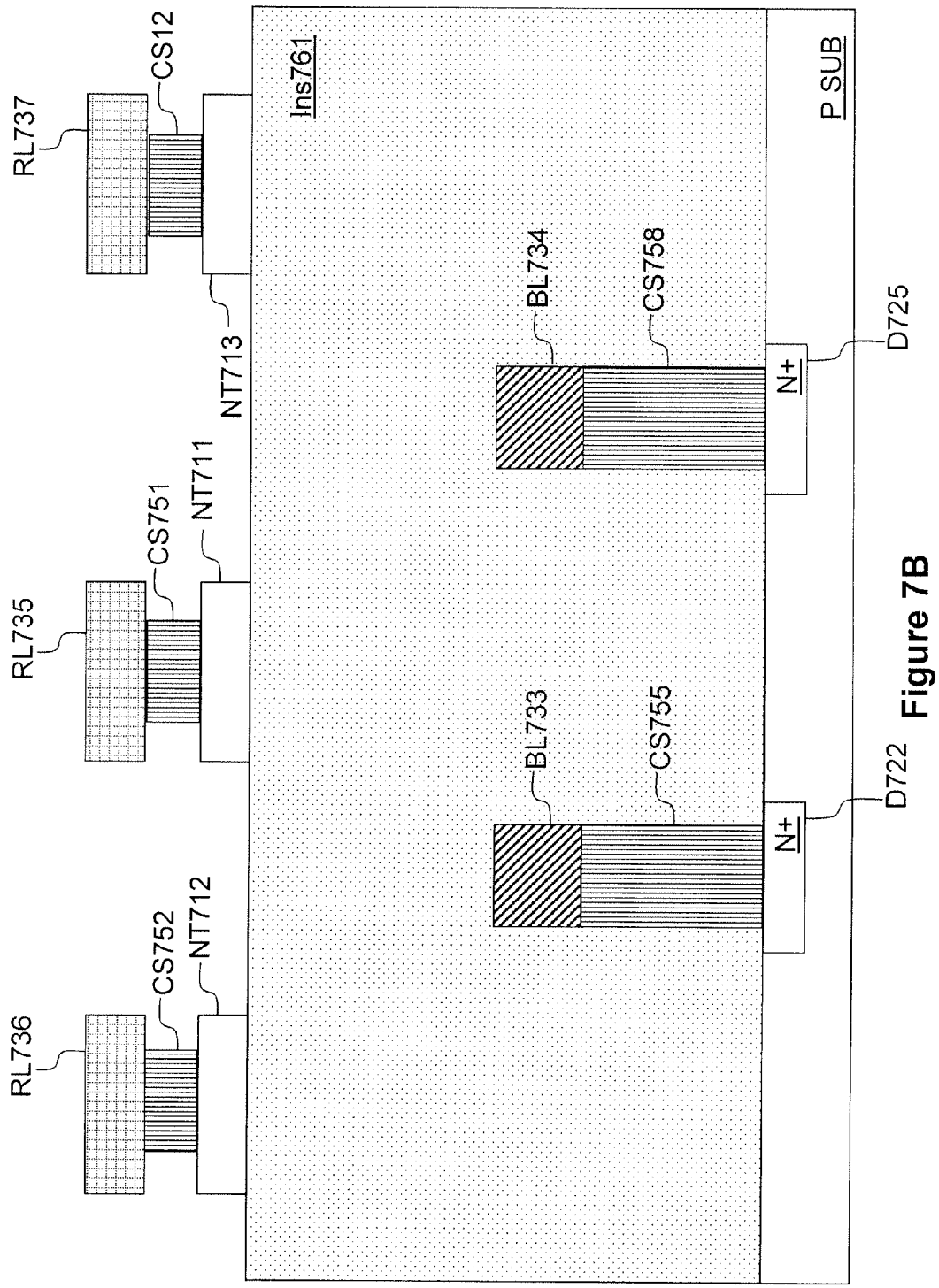

In another alternative configuration, a plurality of release lines are positioned in a plane above the nanotube element plane, as illustrated in FIGS. 7A-7B. As illustrated in FIG. 7A, plurality of devices 701 is for the most part arranged analogously to devices 301 of FIG. 3A. For example, the plurality of devices includes first and second shared-drain FETs SDFET741, SDFET742; first and second word lines WL731, WL732 positioned over respective channels (not shown) of SDFET741, SDFET742; and first and second bit lines BL733, BL734 in respective electrical communication with shared drain region D732 of SDFET741 and shared drain region D725 of SDFET742. Like devices 301, devices 701 also include first, second, and third nanotube elements NT711, NT712, NT613. However, unlike devices 301, a plurality of reference lines are positioned in a plane over the nanotube elements, and are arranged parallel to the nanotube elements. Specifically, a first reference line RL735 is positioned over first nanotube element NT711, a second reference line RL735 is positioned over second nanotube element NT712, and a third reference line RL737 is positioned over third nanotube element NT713. FIG. 7B illustrates a cross-sectional view of devices 701 along line H-H', in which conductive studs CS751, CS752, and CS753 can be seen to provide electrical communication between nanotube elements NT711, NT712, NT713 and their respective reference lines. In another alternative embodiment (not illustrated), the reference lines are positioned directly on top of the corresponding nanotube elements, and the conductive studs are omitted.

Figure 8A:
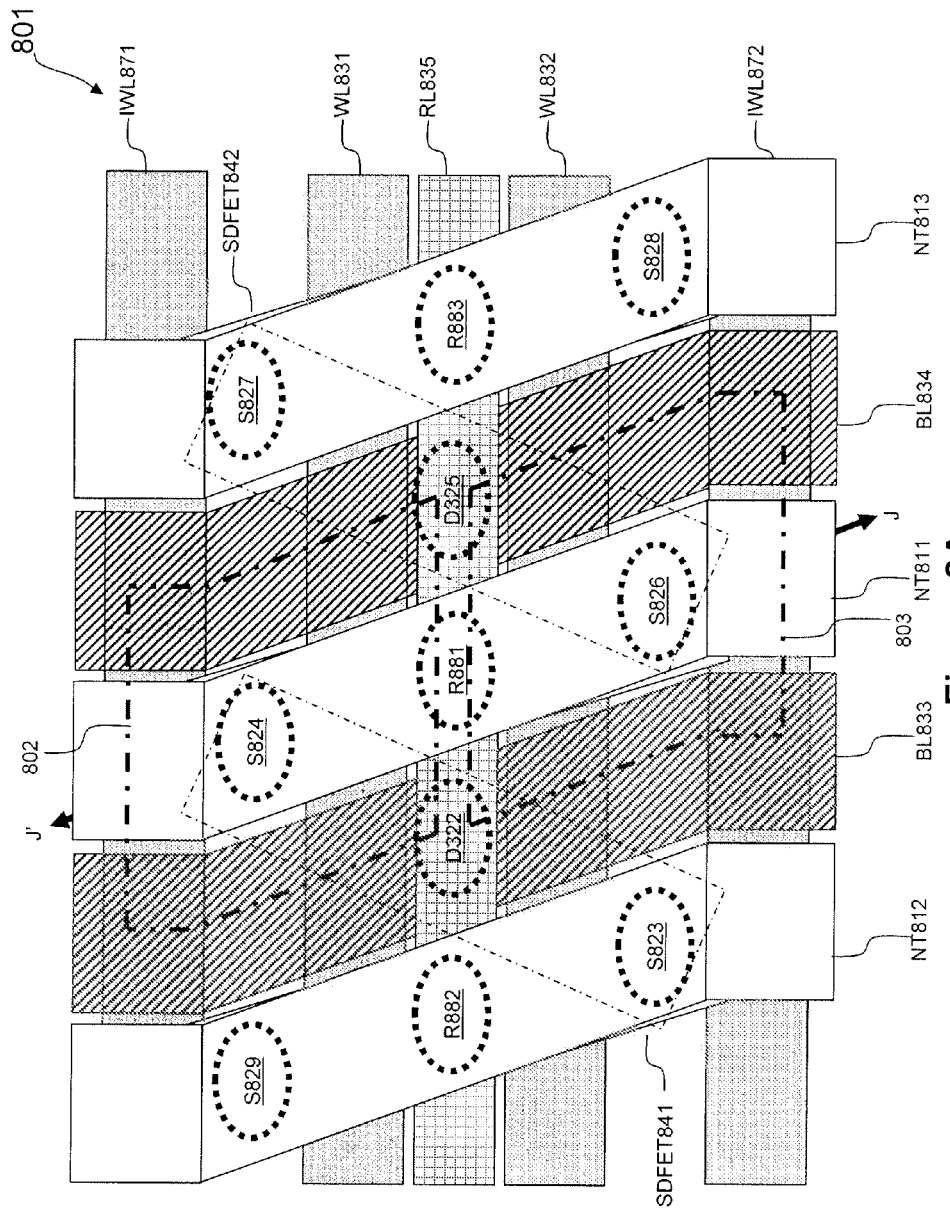
FIGS. 8A-8B schematically illustrate plan and cross-sectional views, respectively, of an alternative arrangement of switching devices, according to exemplary embodiments.
Figure 8B:
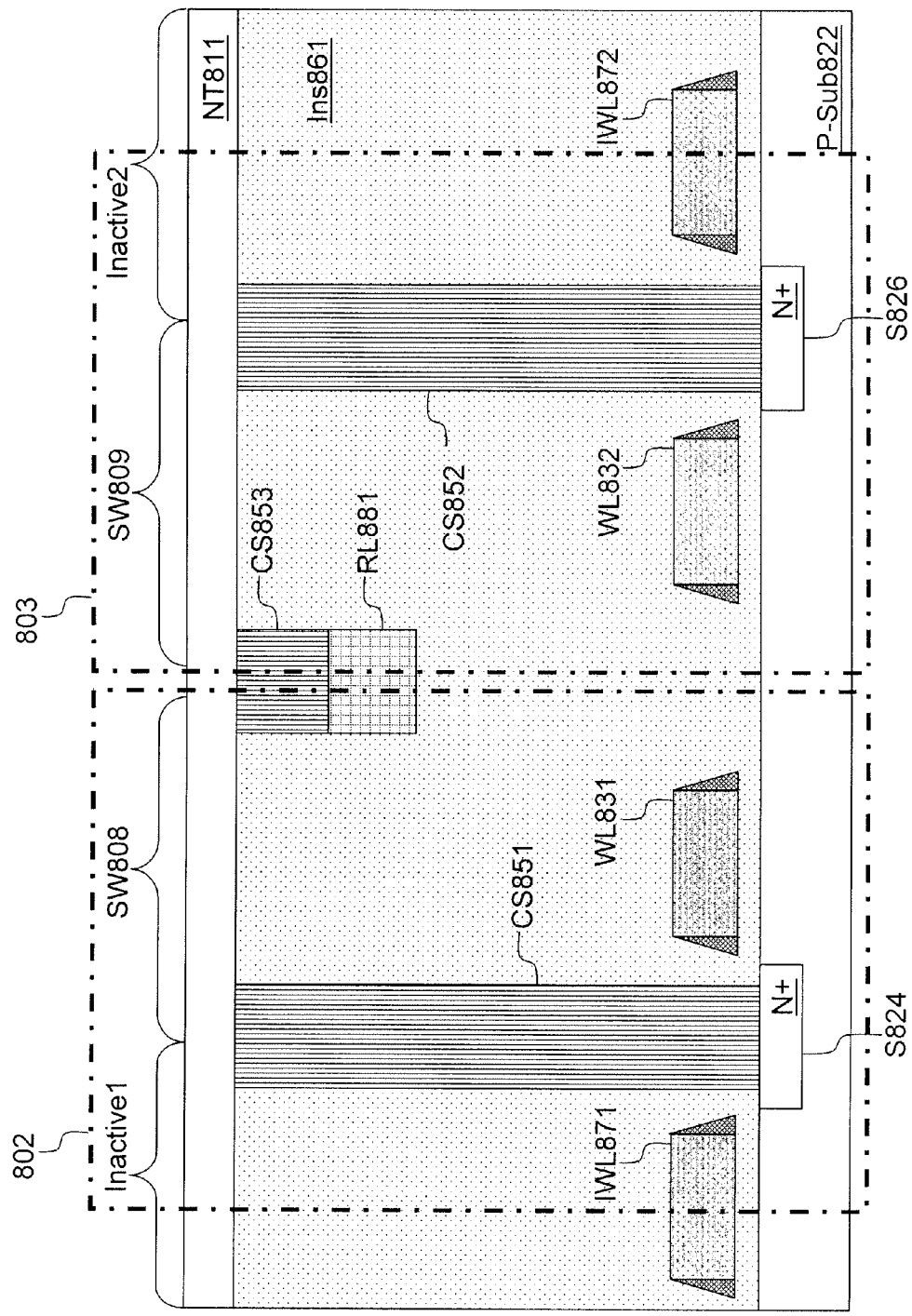

In another alternative configuration, the nanotube elements are provided as traces having three or more adjustable resistance regions along their lengths, as illustrated in FIGS. 8A-8B. As illustrated in FIG. 8A, plurality of devices 801 is for the most part arranged analogously to devices 301 of FIG. 3A. For example, the plurality of devices includes first and second shared-drain FETs SDFET841, SDFET842; first and second word lines WL831, WL832 positioned over respective channels (not shown) of SDFET841, SDFET842; and first and second bit lines BL833, BL834 in respective electrical communication with shared drain region D832 of SDFET841 and shared drain region D825 of SDFET842. Like devices 301, devices 801 also include first, second, and third nanotube elements NT811, NT812, NT813. However, unlike nanotube elements NT311, NT312, and NT313, nanotube elements NT811, NT812, and NT813 are arranged as "traces," i.e., long strips of nanotube fabric that run parallel to bit lines BL833, BL834 and cross multiple pairs of word lines, isolation word lines, and shared-drain FET active areas. As such, each nanotube element NT811, NT812, NT813 can include three or more switching regions, some of which are separated from one another by inactive regions.

For example, FIG. 8B illustrates a cross-sectional view of devices 801 along line J-J', in which nanotube element NT811 extends beyond the area of devices 802, 803. While the resistance of regions SW808 and SW809 of nanotube element NT811 can be independently adjusted by applying appropriate voltages and currents to conductive studs CS851 and CS853, e.g., substantially as described above with reference to FIGS. 3A-3E, nanotube element NT811 also includes first and second inactive regions Inactive1 and Inactive 2, the resistance of which are not significantly altered by activation of various elements in the plurality of devices. Additional active regions of the nanotube element NT811 are positioned adjacent to the inactive regions Inactive1 and Inactive2. For example, an additional device (not illustrated) analogous to device 803 is positioned adjacent, and to the left of, device 802, and also shares nanotube element NT811. The resistance of a third region of nanotube element NT811 of that additional device is independently adjustable by applying appropriate electrical stimulus to the conductive studs of that device. Also, another additional device (not illustrated) analogous to device 802 is positioned adjacent, and to the right of, device 803, and also shares nanotube element NT811. The resistance of a fourth region of nanotube element NT811 of that other additional device is independently adjustable by applying appropriate electrical stimulus to the conductive studs of that device. As such, a single nanotube element may be used to provide three or more, or four or more, or even ten or more, or even 100 or more, or even 1000 or more regions of independently adjustable resistance along its length. Adjacent bits may be substantially independently switched without the resistance state of one bit affecting the resistance state of the other bit (cross talk) because the fringing effect of a resistance state in a selected portion of the nanotube element NT811 can be substantially minimized by virtue of the structural arrangement of the switches formed in the nanotube element NT811 relative to the respective electrical connections thereof (e.g., CS853, CS851 and CS852). This minimization of cross talk is applicable to other embodiments disclosed herein as well.

Figure 9A:
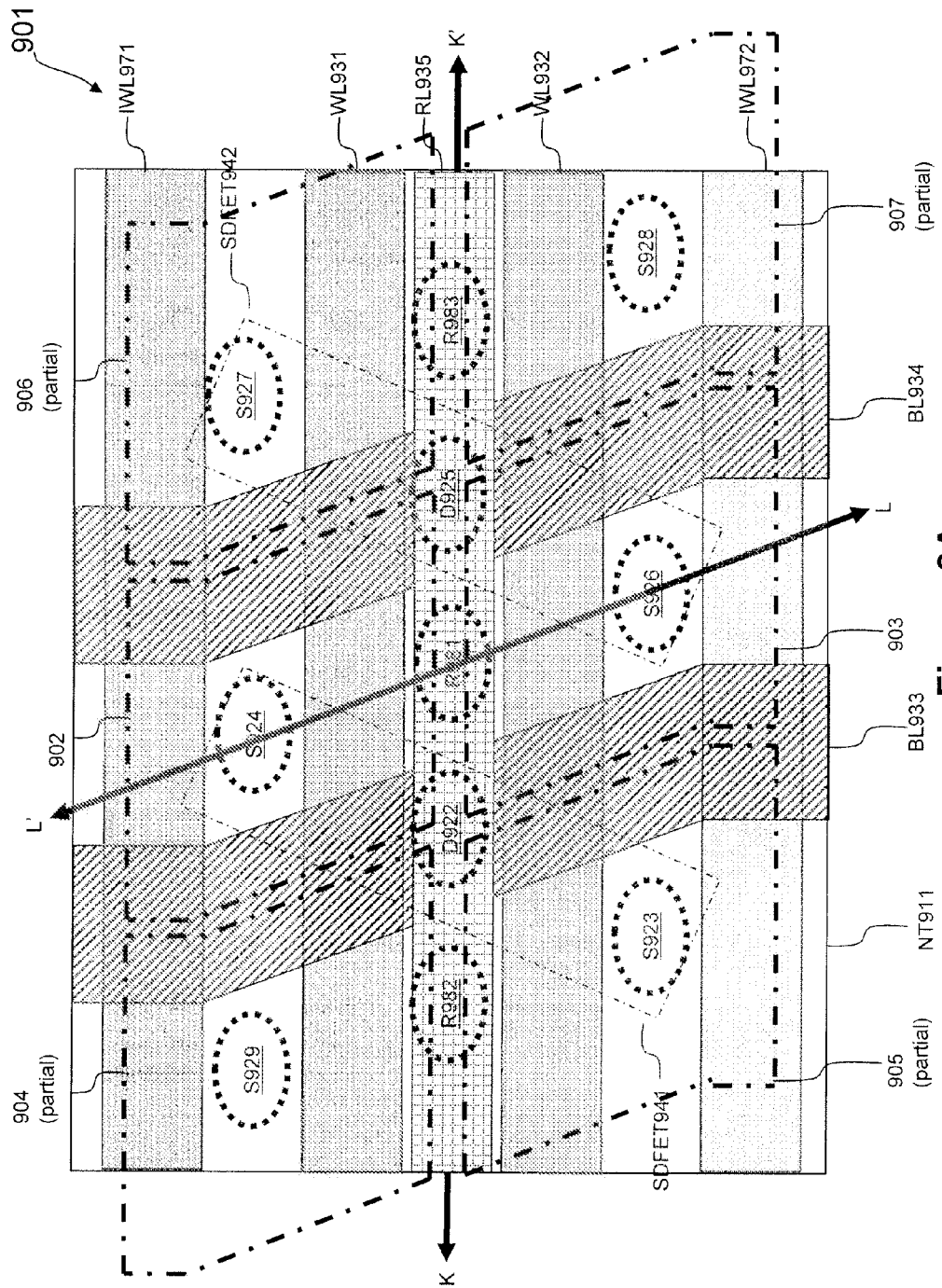
FIGS. 9A-9C schematically illustrate plan and cross-sectional views, respectively, of an alternative arrangement of switching devices, according to some embodiments.
Figure 9B:
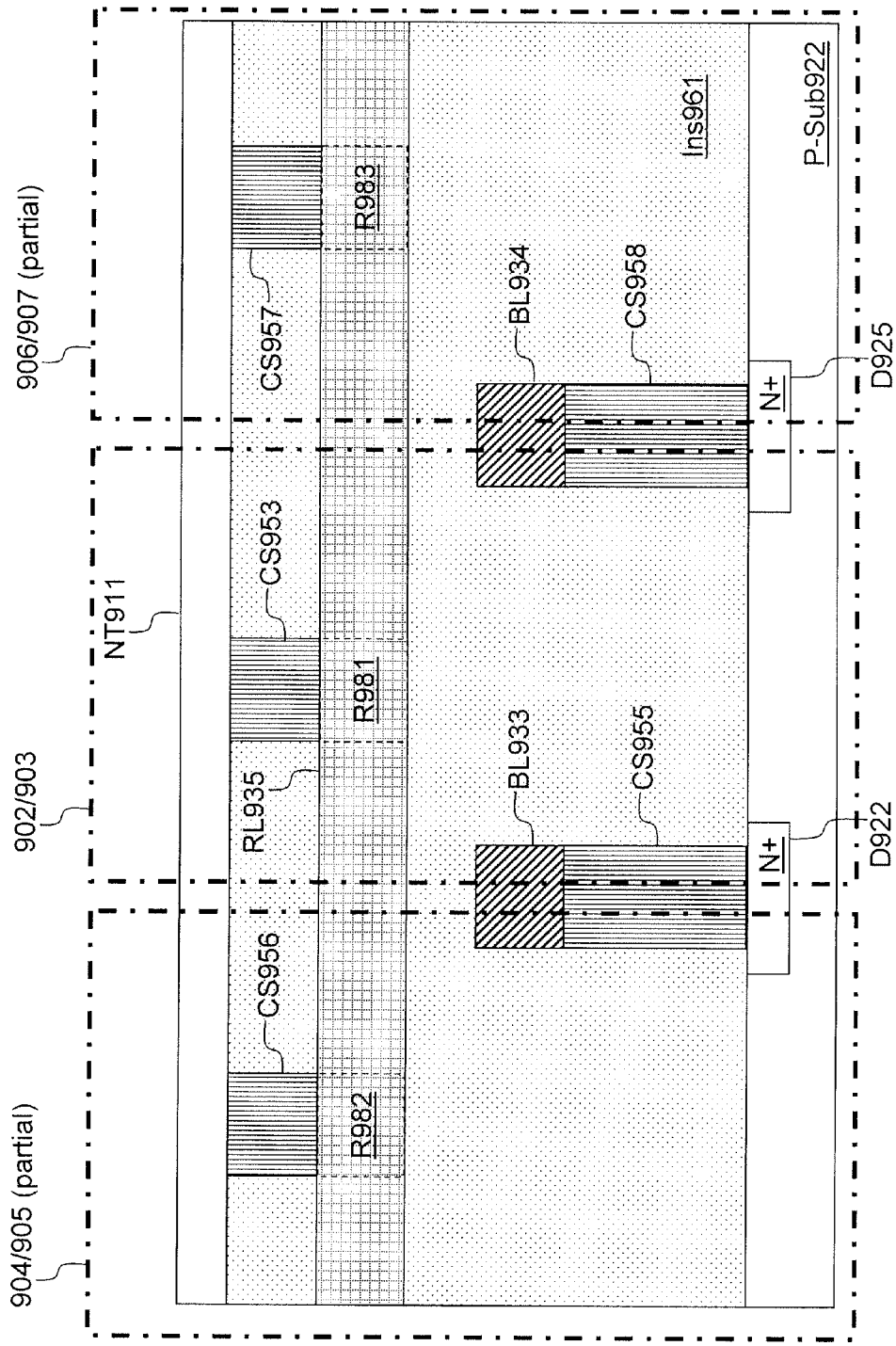
Figure 9C:
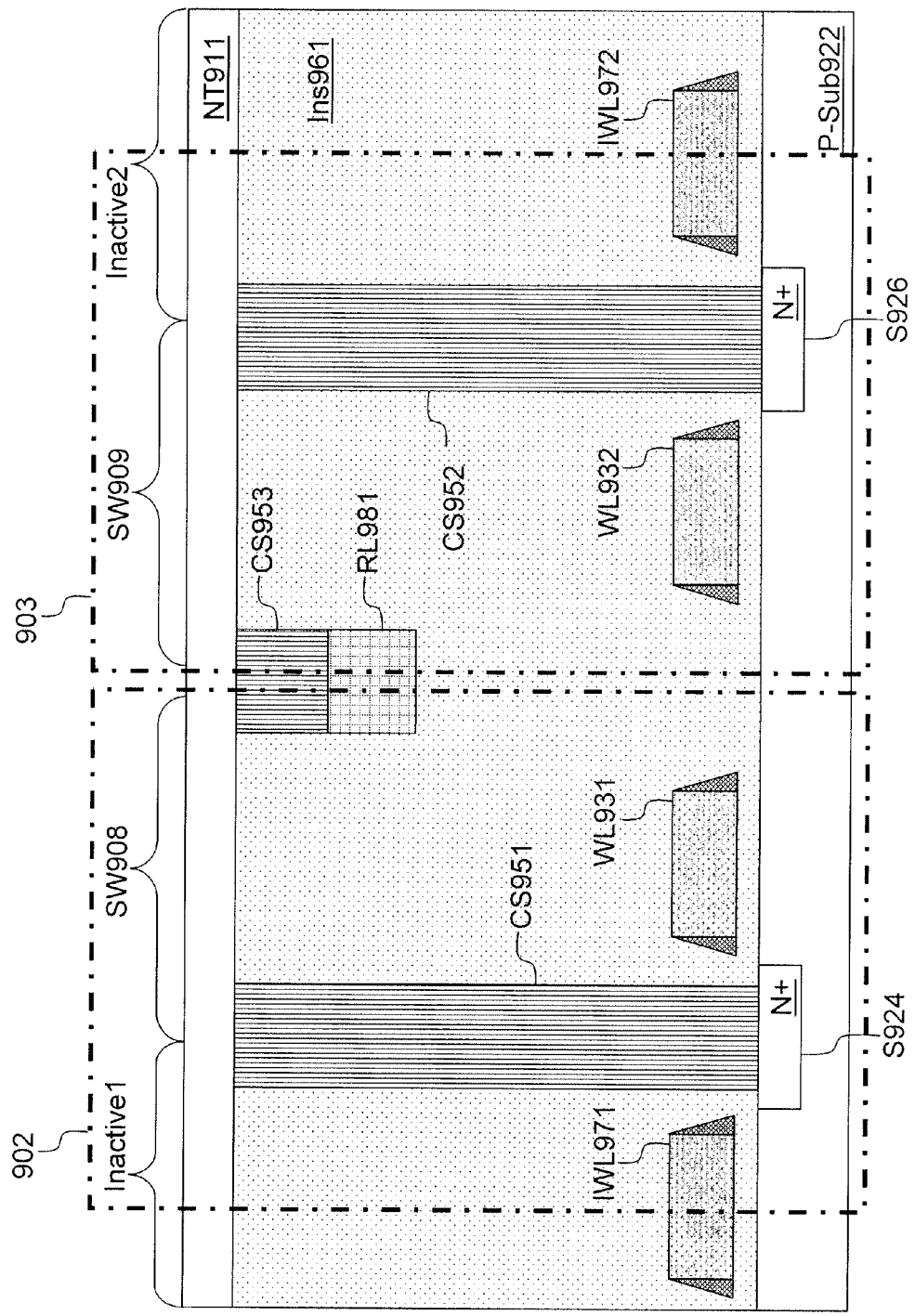

Alternatively, a single nanotube element can be arranged as a "plane" that has a large plurality of adjustable resistance regions along both its length and width, as illustrated in FIGS. 9A-9C. As illustrated in FIG. 9A, plurality of devices 901 is largely arranged analogously to devices 301 of FIG. 3A. For example, the plurality of devices 901 includes first and second shared-drain FETs SDFET941, SDFET942; first and second word lines WL931, WL932 positioned over respective channels (not shown) of SDFET941, SDFET942; and first and second bit lines BL933, BL934 in respective electrical communication with shared drain region D932 of SDFET941 and shared drain region D925 of SDFET942. Unlike devices 301, the plurality of devices 901 includes a single nanotube element NT911 that is arranged as a "plane," i.e., a sheet of nanotube fabric that extends across multiple pairs of bit lines, word lines, isolation word lines, and shared-drain FET active areas. As such, the nanotube element NT911 includes a large plurality of switching regions, some of which are separated from one another by inactive regions. For example, FIG. 9B illustrates a cross-sectional view of devices 901 along line K-K', in which nanotube element NT911 is shared among devices 902, 903, 904, 905, 906, and 906. The resistance of different regions of nanotube element NT911 can is independently adjustable by applying appropriate electrical stimuli to the conductive studs of the corresponding devices.

For example, FIG. 9C illustrates a cross-sectional view of devices 901 along line L-L'. While the resistance of regions SW908 and SW909 of nanotube element NT911 can be independently adjusted by applying appropriate voltages and currents to conductive studs CS951 and CS953, e.g., substantially as described above with reference to FIGS. 3A-3E, nanotube element NT911 also includes first and second inactive regions Inactive 1 and Inactive 2, the resistance of which are not significantly altered by activation of various elements in the plurality of devices. Analogous to the embodiment illustrated FIGS. 8A-8B, additional active regions of the nanotube element NT911 are positioned adjacent to the inactive regions Inactive1 and Inactive2. As such, a single nanotube element may be used to provide three or more, or four or more, or even ten or more, or even 100 or more, or even 1000 or more regions of independently adjustable resistance along both its length and its width. Adjacent bits may be substantially independently switched without the resistance state of one bit affecting the resistance state of the other bit (cross talk) because the fringing effect of a resistance state in a selected portion of the nanotube element NT911 can be substantially minimized by virtue of the structural arrangement of the switches formed in the nanotube element NT911 relative to the respective electrical connections thereof (e.g., CS953, CS956 and CS957). Additionally, the fabrication of the embodiment illustrated in FIGS. 9A-9C can be simplified relative to that of the embodiments illustrated in FIGS. 3A-8B, because nanotube element NT911 need not be patterned.

Figure 10A:
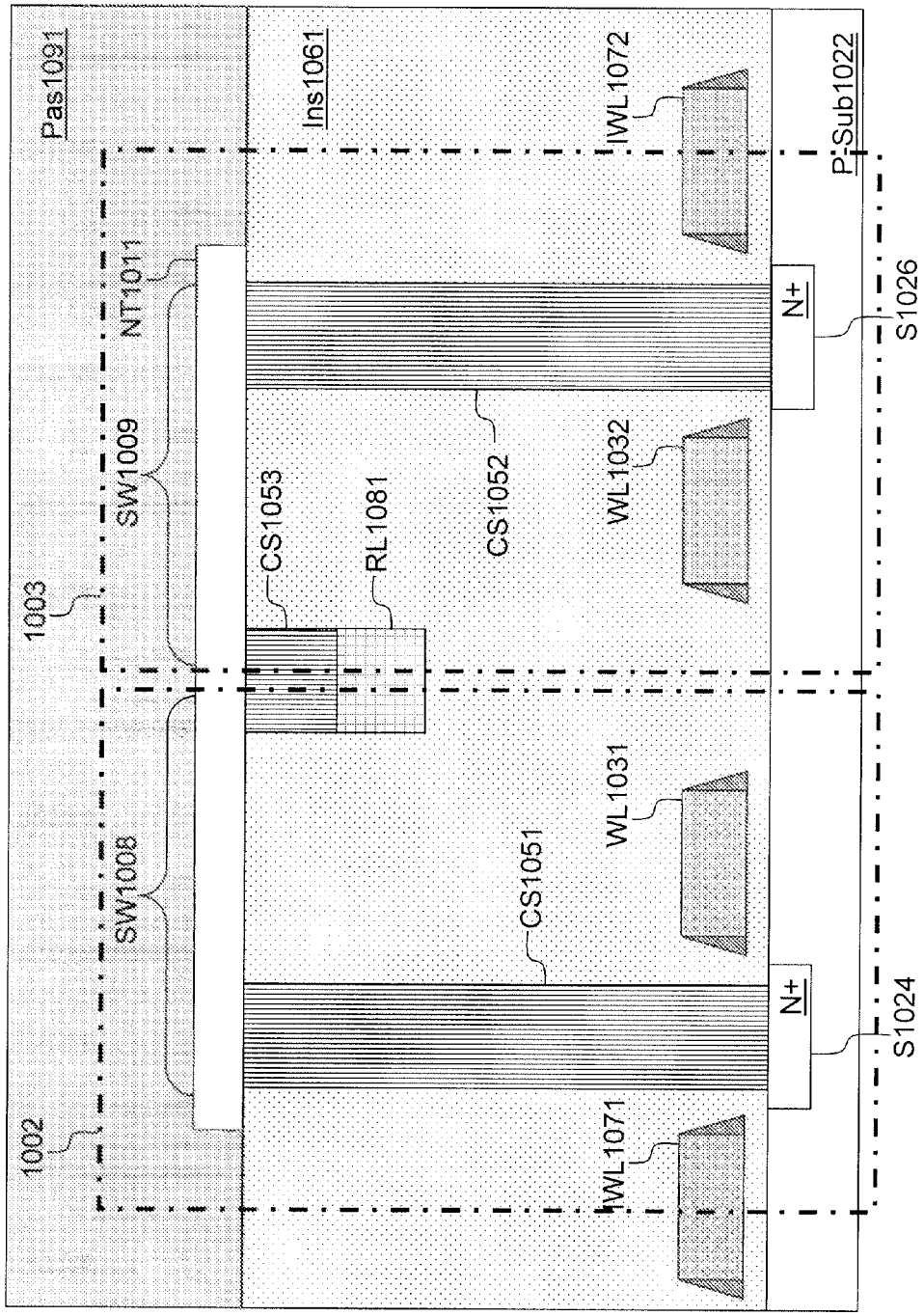
FIGS. 10A-10B schematically illustrate cross-sectional views of passivated switching devices, according to exemplary embodiments.

As noted above, it can be useful to passivate devices such as those illustrated herein, to both improve performance and enhance the robustness of the devices in a variety of operating environments. FIG. 10A illustrates a cross-sectional device that is analogous to device 301 illustrated in FIG. 3B, but which further includes a passivation layer Pas1091 over the nanotube element. Passivation layer Pas1091 can be any suitable material, including but not limited to such as polyvinylidenefluoride (PVDF), polyimide, $SiO_2$, BeO, tetraethyl orthosilicate (TEOS), silicon nitride, silicon carbide nitride, silicon oxynitride, aluminum oxide, low-k dielectrics such as fluorinated $SiO_2$, spin-on low-k, air gaps, or any layered combination or mixture of materials.

Figure 10B:
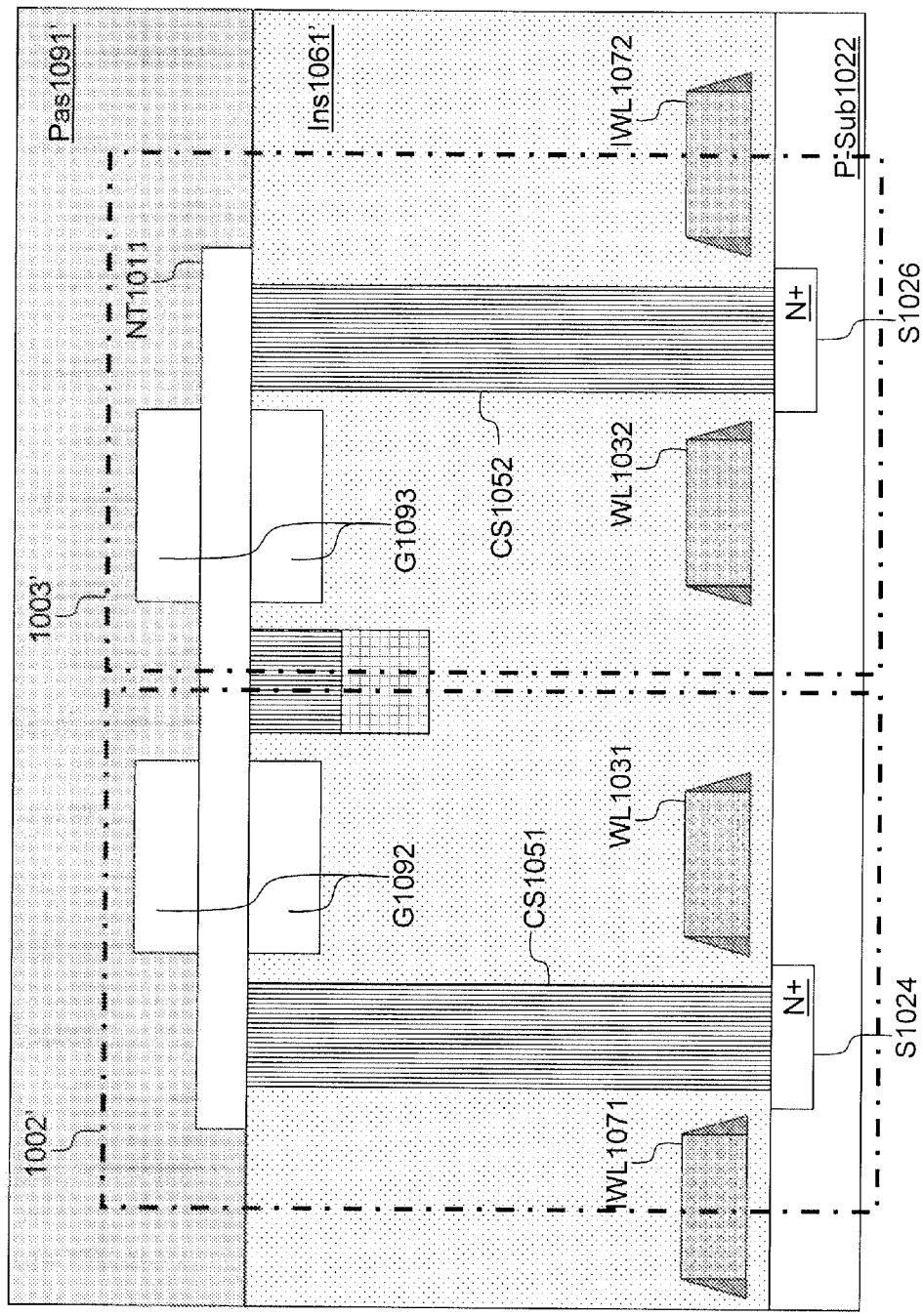

In some embodiments, such as illustrated in FIG. 10B, gaps G1092, G1093 are defined in the insulator layer Ins1061' below the nanotube element NT1011 and in the passivation layer Pas1091' above the nanotube element. Without wishing to be bound by theory, the inventors believe that the adjustability of the resistance of nanotube elements may arise from heating within the nanotube element that causes breaking and reforming of conductive pathways, as described in U.S. Patent Application Publication No. 2008/0012047 entitled "Two-terminal Nanotube Devices and Systems and Methods of Making Same," the entire contents of which are incorporated herein by reference. Therefore, by providing gaps that reduce the amount of heat that is lost to materials that surround the nanotube element, e.g., heat that would otherwise transfer to insulator layer Ins1061' and Pas1091' via physical contact, smaller voltages and currents can potentially be used to heat the nanotube element to a temperature sufficient to change its resistance. In alternative embodiments, gaps are provided only below, or only above, the nanotube element. Provision of gaps adjacent nanotube elements are described, for example, in U.S. Patent Application Publication No. US 2008/0158936 entitled "Nonvolatile Resistive Memories Having Scalable Two-Terminal Nanotube Switches," the entire contents of which are incorporated herein by reference.

Figure 11:
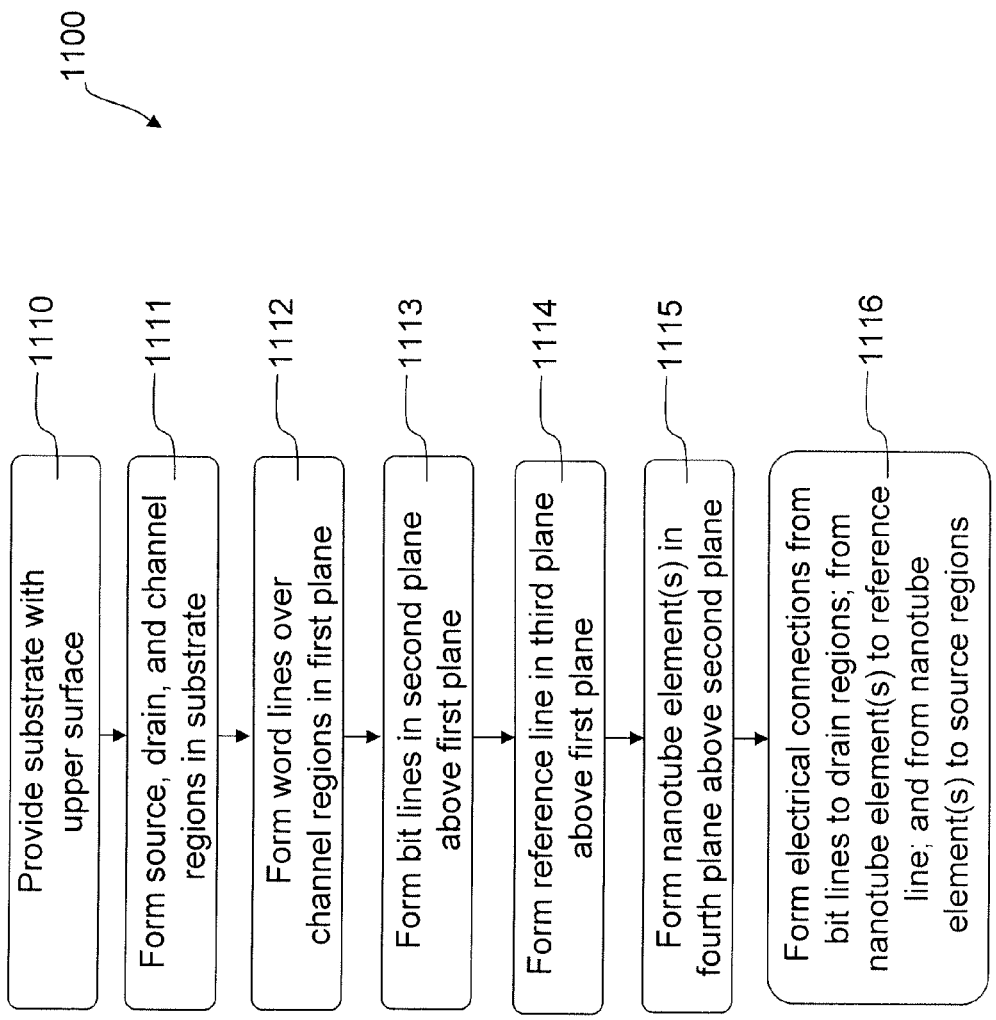
FIG. 11 illustrates an overview of steps in an exemplary method of forming a state-storing device.

FIG. 11 illustrates an overview of steps in a method 1100 of fabricating a nonvolatile switching device with nanotube elements in a plane above the bit line plane, according to some embodiments.

First, a substrate having an upper surface is provided (1110). For example, the substrate can be a conventional semiconductor wafer, such as a p-type silicon wafer. The substrate can include one or more layers thereon, such as metal, insulator, and/or semiconductor layers.

Then, shared-drain FET active areas are defined in the substrate (1111). The active areas include source regions, drain regions, and channel regions disposed between the source regions and drain regions. In one embodiment, each of the active areas includes a drain, first and second sources, and first and second channel regions, the first channel being between the drain and the first source, and the second channel being between the drain and the second source, such as SDFET341 and SDFET342 illustrated in FIGS. 3A-3E. Any suitable method can be used to form source regions, drain regions, and channel regions in the substrate, such as ion implantation. Additionally, salicides formed using titanium, cobalt, nickel, platinum, and tungsten, for example, can be formed on the source and/or drain regions to reduce the contact resistance between subsequently formed conductive studs and the source or drain regions.

Then, word lines are formed over the channel regions, in a first plane positioned above the upper surface of the substrate (1113). In embodiments that include isolation word lines, e.g., IWL371, IWL372 illustrated in FIGS. 3A-3E, step 1113 can also include the fabrication of such isolation word lines. Step 1113 can include the formation of an insulator layer, such as a silicon nitride spacer, over the channel regions, followed by deposition of a conductor, such as a conducting nanotube fabric, polysilicon, Ru, Cr, W, Mo, Ir, Pb, Sn, Ti, TiN, Al, Ta, TaN, Cu, Ru, RuO, Pd, Co, $CoSi_x$, Ni, $NiSi_x$, $TiSi_x$, Au, Ag, any layered combination or alloy thereof, such as Ti/TiN/W, or any other suitable conductor known in the art. The conductor layer is then patterned using conventional techniques, such as by applying a mask, for example SiN, photolithographically patterning the mask to expose portions of the conductor layer, etching the exposed portions of the conductor layer to form the word lines over the channel regions, and then removing the mask. In one embodiment, the conductor is TiN and the etch is performed using $BCl_3/Cl_2$. Alternatively, grooves of appropriate dimension can be patterned in a photoresist, and filled with a conductor and planarized. Some exemplary methods of forming conductive lines can also be found in the following publications, the entire contents of each of which are incorporated by reference herein: U.S. Pat. Nos. 7,329,610 and 7,332,767, and "A 78 nm $6F^2$ DRAM Technology for Multigigabit Densities," VLSI Technology Symposium, 1994. Additionally, pitch-multiplication techniques such as described in U.S. Pat. No. 7,253,118, entitled "Pitch Reduced Patterns Relative to Photolithography Features," the entire contents of which are incorporated by reference herein, can optionally be used to reduce the size of features formed using photolithography.

Then, bit lines are formed in a second plane positioned above the first plane (1113). Step 1113 can include the deposition of a conductor, which is then patterned to form the bit line using any suitable materials and techniques, such as described above for the word lines.

Then, a reference line is formed in a third plane positioned above the first plane (1114). The reference line plane can be positioned either above or below the bit line plane, or above or below the nanotube element plane. Step 1114 can include the deposition of a conductor, which is then patterned to form the reference line using any suitable materials and techniques, such as described above for the word lines.

At various steps during the processing, insulating materials, such as insulator Ins261 shown in FIG. 1 can be deposited in any suitable manner. Insulating materials can provide structural support and electrical isolation for the various electrical elements described herein. The insulators can be formed from any suitable insulating material, such as $SiO_2$, BeO, polyimide, tetraethyl orthosilicate (TEOS), silicon nitride, silicon carbide nitride, silicon oxynitride, aluminum oxide, low-k dielectrics such as fluorinated $SiO_2$, spin-on low-k, air gaps, or any layered combination or mixture of such materials using any suitable deposition methods or combination of deposition methods as known to those of ordinary skill in the art.

Then, nanotube element(s) are formed in a fourth plane positioned above the first and second planes (1115). In some embodiments, a nonwoven nanotube fabric is applied to the thus-fabricated structure, for example, by spin-coating, spray-coating, or the like. The nanotube fabric can be substantially a monolayer of nanotubes, or can be a multilayer of nanotubes. Additionally, the nanotube fabric can include single-walled nanotubes (SWNT), multi-walled nanotubes (MWNT), or a mixture of the two; and can also include metallic nanotubes, semiconducting nanotubes, or a mixture of the two. Formation of the nanotube element(s) optionally also includes patterning the nanotube fabric to form a plurality of discrete nanotube elements, such as patches as illustrated in FIGS. 3A-3E, or traces as illustrated in FIGS. 8A-8B. Such patterning can include, for example, forming and photolithographically patterning a mask layer over the nanotube fabric to expose regions of the nanotube fabric, etching the exposed regions of the nanotube fabric to form the nanotube elements, e.g., using an $O_2$/Ar etch, and removing the mask layer. Alternatively, the nanotube fabric can be left unpatterned to provide a nanotube plane, as illustrated in FIGS. 9A-9C, obviating the need for an additional patterning step. Exemplary methods for forming and patterning nonwoven nanotube fabrics can be found, for example, in U.S. Pat. No. 6,835,591, entitled "Methods of Nanotube Films and Articles," the entire contents of which are incorporated by reference herein.

Method 1100 also includes forming electrical connections between the bit lines and drain regions; between the nanotube element(s) and reference line; and between the nanotube element(s) and source regions (1116). The connections can be formed of any suitable conductor, including but not limited to conductive nanotube fabric, polysilicon, Ru, Cr, W, Mo, Ir, Pb, Sn, Ti, TiN, Al, Ta, TaN, Cu, Ru, RuO, Pd, Co, $CoSi_x$, Ni, $NiSi_x$, $TiSi_x$, Au, Ag, or any layered combination or alloy thereof. Note that such electrical connections need not be formed at the end of method 1100, but instead can be formed during any appropriate time in the fabrication process, and using any suitable method. For example, referring to FIG. 3B, conductive studs CS351, CS352, and CS353 can be formed at any appropriate time after forming word lines WL331, WL332 and isolation word lines IWL371, IWL372 (step 1112), and before forming nanotube element NT311 (step 1115). Or, for example, referring to FIG. 3D, conductive studs CS355, CS338 can be formed at any appropriate time after forming shared-drain regions D322, D325 (step 111), and before folining bit lines BL333, BL334 (step 1113). Similarly, still referring to FIG. 3D, conductive studs CS356, CS353, CS357 can be formed at any appropriate time after forming reference line RL335 (step 1114) and before forming nanotube elements NT311, NT312, NT313 (step 1115). Alternatively, as illustrated in FIG. 5B, nanotube elements NT511, NT512, NT513 can instead be deposited directly onto reference line RL535, obviating the need to separately fabricate conductive studs therebetween.

Note that one or more of the above-described steps can include the formation, patterning, and/or planarization of insulator layers that support and insulate the conductive elements, such as insulator layer Ins361 illustrated in FIGS. 3A-3E. Additionally, as described above, the devices can be passivated, optionally, with gaps defined above and/or below the nanotube element. One of ordinary skill in the art, having the benefit of the present disclosure, could readily devise a process flow for forming the desired device elements, as well as any appropriate interconnections therebetween.

In some embodiments, the switching devices are used to store information in a memory system. The information stored is nonvolatile; that is, if power is removed, information is not lost. In one embodiment, the memory system includes an array of devices analogous to those illustrated in FIGS. 3A-3F. As discussed above, an array of such devices includes a substrate having a plurality of active areas defined therein, each active area having a source region, a drain region, and a channel region disposed between the source region and the drain region. The array of devices also includes a plurality of word lines in a first plane positioned above the substrate surface, each word line disposed over one of the channel regions; a plurality of bit lines in a second plane positioned above the first plane, each bit line in electrical communication with one of the drain regions; and a plurality of reference lines in a third plane positioned above the third plane. The array of devices further includes at least one nanotube element in a fourth plane positioned above the first and second planes, e.g., a plurality of discrete nanotube patches or traces, or a single nanotube plane. The at least one nanotube element includes a plurality of regions, each of which is in electrical communication with a source region and a reference line and has a resistance state that is independently adjustable responsive to electrical stimulus on a word line and at least one of a bit line and a reference line. In some embodiments, each nanotube element region shares a reference line with at least one adjacent nanotube element region, and each nanotube element region further shares a bit line with at least one adjacent nanotube element region.

The memory system further includes peripheral circuitry for applying appropriate electrical stimulus to the word lines, bit lines, and reference lines of the array. For example, the memory system can include an address I/P buffer for receiving and latching address locations (bits) from a computer system; a word decoder for selecting a word address within the device array; word line select logic for applying electrical stimulus to the appropriate word lines; a bit decoder for selecting a bit address within the device array; bit line select logic for applying electrical stimulus to the appropriate bit lines; and a data multiplexer/sense amplifier for reading and writing data to the device array. The peripheral circuitry can further include timing circuitry, read/write buffers, and other appropriate components with which one of ordinary skill in the art will be familiar.

Alternatively, the switching devices can be used to provide functionality in a nonvolatile field-programmable gate array (NFPGA) logic device. For example, as described in U.S. patent application Ser. No. 12/536,736, filed Aug. 6, 2009 and entitled "Nonvolatile Nanotube Programmable Logic Devices And A Nonvolatile Nanotube Field Programmable Gate Array Using Same," the entire contents of which are incorporated by reference herein, an array of devices including two-terminal switches coupled to FETs can be used to provide various functions in an NFPGA logic device, such as nonvolatile configurable logic blocks (CLB) and nonvolatile programmable switch matrix (CSM) functions. For example, an array of devices can be used to generate a look up table (LUT) in a CLB; because the devices nonvolatilely retain their resistance (logic) states, the LUT and CLB are similarly nonvolatile. An array of the devices provided herein can be used in place of the devices described in U.S. patent application Ser. No. 12/536,736, and thus provide enhanced functionality with reduced footprint, e.g., as described in greater detail above.

Alternative Embodiments

The nanotubes used in the devices can optionally be derivitized, covalently or non-covalently, to modify their functionality. For example, a functional molecular or atomic layer, or layers, can be applied to the surfaces of the nanotubes to cause them to bond to another material in the devices, such as to a conductor (e.g., W, TiN, or Ta). Such bonding can reduce the value of the contact resistance between the nanotubes and the material, or enhance the reproducibility of the value of the contact resistance between the nanotubes and the material, and can extend the life of the device. Alternatively, a thin oxide layer (e.g., one thin enough to permit tunneling) can be interposed between the nanotubes and the material, to modify the contact resistance between the two. Derivitization can also be used to modify the adjustability of the nanotube element's resistance state, for example, by modifying the interaction between the nanotubes and each other and/or by modifying the interaction between the nanotubes and the conductive elements it contacts.

In still other embodiments, nanowires (nanorods) and nanoparticles of various materials can be used in addition to (i.e., in combination with) the nanotubes as part of a nanotube element (e.g., nanotube fabric). Examples of nanowires (nanorods) include, but are not limited to, alumina, bismuth, cadmium, selenide, gallium nitride, gold, gallium phosphide, germanium, silicon, indium phosphide, magnesium oxide, nickel, palladium, silicon carbide, titanium, zinc oxide, and mixed nanowires such as silicon germanium or other types, and optionally may be coated. Such nanowires (nanorods) can, for example, enhance mechanical strength or modify the electrical properties of the nanotube elements. In yet other embodiments, amorphous carbon can be combined with the nanotubes and/or nanowires to provide composite nanomaterials.

In addition to, or instead of, amorphous carbon, other allotropes of carbon may be used. For example, CNTs and graphene flakes may be combined in a solution and applied to a substrate from a solution, as is done for CNTs when forming nanotube fabric layers, getting the benefits of both graphene and CNTs. Alternatively, graphene flakes and CNTs may be deposited separately when forming nanotube fabric layers.

It will be further appreciated that the scope of the present invention is not limited to the above-described embodiments but rather is defined by the appended claims and that these claims will encompass modifications of and improvements to what has been described.

What is claimed is:

1. An electrical device, comprising:
    a substrate having an upper surface;
    a first active area in the substrate, comprising a first source region, a first drain region, and a first channel region disposed between the first source region and the first drain region;
    a second active area in the substrate, comprising a second source region and the second drain region;
    a first word line and a second word line disposed in a first plane positioned above the upper surface of the substrate, wherein the first word line is disposed over the first channel region, and the second word line is disposed over the second channel region;
    a first bit line in electrical communication with the first active area, and a second bit line in electrical communication with the second active area, the first and second bit lines disposed in a second plane positioned above the first plane, wherein the first bit line is in electrical communication with the first drain region, and the second bit line is in electrical communication with the second drain region;
    a first reference line disposed in a third plane positioned above the first plane; and
    a first nanotube element disposed in a fourth plane positioned above the first and second planes, the first nanotube element having a first surface and extending laterally in the fourth plane parallel to a plane of the substrate, the first nanotube element being in electrical communication with the first active region, the second active region and the first reference line via electrical contacts at the first surface of the first nanotube element,
    the first nanotube element comprising a first region and a second region, the first and second regions having resistance states that are independently adjustable in response to electrical stimuli, the first and second regions nonvolatilely retaining said resistance states,
    a third active area in the substrate, the third active area comprising a third source region, the first drain region, and a third channel region disposed between the third source region and the first drain region;
    a fourth active area in the substrate, the fourth active area comprising a fourth source region, the second drain region, and a fourth channel region disposed between the fourth source region and the second drain region;
    a third word line disposed over the third channel region, and a fourth word line disposed over the fourth channel region, the third and fourth word lines being disposed in the first plane;
    second and third reference lines disposed in the third plane;
    a second nanotube element in electrical communication with the third source region and the second reference line, a resistance state of the second nanotube element being independently adjustable responsive to electrical stimulus on the third word line and at least one of the first bit line and the second reference line; and
    a third nanotube element in electrical communication with the fourth source region and the third reference line, a resistance state of the third nanotube element being independently adjustable responsive to electrical stimulus on the fourth word line and at least one of the second bit line and the third reference line.

2. An electrical device, comprising:
    a substrate having an upper surface;
    a first active area in the substrate;
    a second active area in the substrate;
    a first word line and a second word line disposed in a first plane positioned above the upper surface of the substrate;
    a first bit line in electrical communication with the first active area, and a second bit line in electrical communication with the second active area, the first and second bit lines disposed in a second plane positioned above the first plane, wherein at least a portion of each of first and second bit lines is arranged at an obtuse angle relative to the first and second word lines;
    a first reference line disposed in a third plane positioned above the first plane; and
    a first nanotube element disposed in a fourth plane positioned above the first and second planes, the first nanotube element having a first surface and extending laterally in the fourth plane parallel to a plane of the substrate, the first nanotube element being in electrical communication with the first active region, the second active region and the first reference line via electrical contacts at the first surface of the first nanotube element,
    the first nanotube element comprising a first region and a second region, the first and second regions having resistance states that are independently adjustable in response to electrical stimuli, the first and second regions nonvolatilely retaining said resistance states.

3. The device of claim 2, wherein the first and second channel regions are arranged at an acute angle relative to the first and second word lines.

4. The device of claim 3, wherein the obtuse angle is about 104°, and wherein the acute angle is about 76°.

5. The device of claim 3, wherein at least a portion of the first nanotube element is arranged at the obtuse angle relative to the first and second word lines.

6. The device of claim 5, wherein the first nanotube element is laterally offset relative to the first and second bit lines.

7. An electrical device, comprising:
a substrate having an upper surface;
a first active area in the substrate;
a second active area in the substrate;
a first word line and a second word line disposed in a first plane positioned above the upper surface of the substrate;
a first bit line in electrical communication with the first active area, and a second bit line in electrical communication with the second active area, the first and second bit lines disposed in a second plane positioned above the first plane;
a first reference line disposed in a third plane positioned above the first plane; and
a first nanotube element disposed in a fourth plane positioned above the first and second planes, the first nanotube element having a first surface and extending laterally in the fourth plane parallel to a plane of the substrate,
the first nanotube element being in electrical communication with the first active region, the second active region and the first reference line via electrical contacts at the first surface of the first nanotube element,
the first nanotube element comprising a first region and a second region, the first and second regions having resistance states that are independent adjustable in response to electrical stimuli, the first and second regions nonvolatilely retaining said resistance states,
wherein the first nanotube element extends over the first and second active areas, the first and second word lines, and the first and second bit lines.

8. A method of making an electrical device, the method comprising:
providing a substrate;
forming first and second active areas in the substrate, where the first active area comprises a first source region, a first drain region, and a first channel region disposed between the first source region and the first drain region, and the second active are comprises a second source region, a second drain region, and a second channel region disposed between the second source region and the second drain region, the method comprising forming the first word line over the first channel region, and forming the second word line over the second channel region;
forming a first word line and a second word line in a first plane positioned above the upper surface of the substrate;
forming first and second bit lines in a second plane positioned above the first plane;
forming a first reference line in a third plane positioned above the upper surface of the substrate;
forming a first nanotube element in a fourth plane positioned above the first and second planes, the first nanotube element having a first surface and extending laterally in the fourth plane parallel to a pane of the substrate; and
forming electrical connections between the first bit line and the first active area, between the second bit line and the second active area, between the first nanotube element and the first reference line, between the first nanotube element and the first active region, and between the first nanotube element and the second active region, such that the first nanotube element is in electrical communication with the first active region, the second active region and the first reference line via electrical contacts at the first surface of the first nanotube element;
forming third and fourth active areas in the substrate, the third active area comprising a third source region, the first drain region, and a third channel region disposed between the third source region and the first drain region, the fourth active area comprising a fourth source region, the second drain region, and a fourth channel region disposed between the fourth source region and the second drain region;
forming a third word line over the third channel region, and forming a fourth word line over the fourth channel region, the third and fourth word lines being disposed in the first plane;
forming second and third reference lines disposed in the third plane;
forming second and third nanotube elements disposed in the fourth plane; and
forming electrical connections between the second nanotube element and the third source region, between the second nanotube element and the second reference line, between the third nanotube element and the fourth source region, and between the third nanotube element and the third reference line.

* * * * *